(12) United States Patent
Larson, III et al.

(10) Patent No.: US 7,358,831 B2
(45) Date of Patent: Apr. 15, 2008

(54) FILM BULK ACOUSTIC RESONATOR (FBAR) DEVICES WITH SIMPLIFIED PACKAGING

(75) Inventors: John D Larson, III, Palo Alto, CA (US); Stephen Ellis, Pleasanton, CA (US); Yury Oshmyansky, Laguna Beach, CA (US)

(73) Assignee: Avago Technologies Wireless IP (Singapore) Pte. Ltd.

( * ) Notice: Subject to any disclaimer, the term of this patent is extended or adjusted under 35 U.S.C. 154(b) by 88 days.

(21) Appl. No.: 10/969,636

(22) Filed: Oct. 19, 2004

(65) Prior Publication Data

US 2005/0110597 A1    May 26, 2005

Related U.S. Application Data

(63) Continuation-in-part of application No. 10/699,289, filed on Oct. 30, 2003, now Pat. No. 7,019,605, and a continuation-in-part of application No. 10/699,481, filed on Oct. 30, 2003, now Pat. No. 6,946,928, and a continuation-in-part of application No. 10/965,541, filed on Oct. 13, 2004, and a continuation-in-part of application No. 10/965,637, filed on Oct. 13, 2004.

(51) Int. Cl.
*H03H 9/54* (2006.01)
*H03H 9/60* (2006.01)

(52) U.S. Cl. .................. 333/187; 333/189; 333/192
(58) Field of Classification Search ......... 333/187–189
See application file for complete search history.

(56) References Cited

U.S. PATENT DOCUMENTS 3,174,122 A    3/1965 Fowler et al.

(Continued)

FOREIGN PATENT DOCUMENTS

DE    101 60 617 A1    6/2003

(Continued)

OTHER PUBLICATIONS

Krishnaswamy, S.V. et al., "Film Bulk Acoustic Wave Resonator Technology", Ultrasonic Symposium, Dec. 1990, vol. 1, pp. 529-536.

(Continued)

*Primary Examiner*—Barbara Summons

(57) ABSTRACT

The encapsulated film bulk acoustic resonator (FBAR) device comprises a substrate, an FBAR stack over the substrate, an element for acoustically isolating the FBAR stack from the substrate, encapsulant covering the FBAR stack, and an acoustic Bragg reflector between the top surface of the FBAR stack and the encapsulant. The FBAR stack comprises an FBAR and has a top surface remote from the substrate. The FBAR comprises opposed planar electrodes and a piezoelectric element between the electrodes. The acoustic Bragg reflector comprises a metal Bragg layer and a plastic Bragg layer juxtaposed with the metal Bragg layer. The large ratio between the acoustic impedances of the metal of the metal Bragg layer and the plastic material of the plastic Bragg layer enables the acoustic Bragg reflector to provide sufficient acoustic isolation between the FBAR and the encapsulant for the frequency response of the FBAR device to exhibit minor, if any, spurious artifacts arising from undesirable acoustic coupling between the FBAR and the encapsulant.

21 Claims, 11 Drawing Sheets

U.S. PATENT DOCUMENTS

| | | | |
|---|---|---|---|
| 3,189,851 A | 6/1965 | Fowler | |
| 3,321,648 A | 5/1967 | Kolm | |
| 3,422,371 A | 1/1969 | Poirier et al. | |
| 3,568,108 A | 3/1971 | Poirier et al. | |
| 3,582,839 A | 6/1971 | Pim et al. | |
| 3,590,287 A | 6/1971 | Berlincourt et al. | |
| 3,607,761 A | 9/1971 | Feighner et al. | |
| 3,610,969 A | 10/1971 | Clawson et al. | |
| 3,826,931 A | 7/1974 | Hammond | |
| 3,845,402 A | 10/1974 | Nupp | |
| 4,084,217 A | 4/1978 | Brandli et al. | |
| 4,172,277 A | 10/1979 | Pinson | |
| 4,272,742 A | 6/1981 | Lewis | |
| 4,281,299 A | 7/1981 | Newbold | |
| 4,320,365 A | 3/1982 | Black et al. | |
| 4,355,408 A | 10/1982 | Scarrott | |
| 4,456,850 A | 6/1984 | Inoue et al. | |
| 4,529,904 A | 7/1985 | Hattersley | |
| 4,625,138 A | 11/1986 | Ballato | |
| 4,719,383 A | 1/1988 | Wang et al. | |
| 4,798,990 A | 1/1989 | Henoch | |
| 4,836,882 A | 6/1989 | Ballato | |
| 4,841,429 A | 6/1989 | McClanahan et al. | |
| 4,906,840 A | 3/1990 | Zdeblick et al. | |
| 5,048,036 A | 9/1991 | Scifres et al. | |
| 5,048,038 A | 9/1991 | Brennan et al. | |
| 5,118,982 A | 6/1992 | Inoue et al. | |
| 5,129,132 A | 7/1992 | Zdeblick et al. | |
| 5,162,691 A | 11/1992 | Mariani et al. | |
| 5,241,209 A | 8/1993 | Sasaki | |
| 5,241,456 A | 8/1993 | Marcinkiewicz et al. | |
| 5,294,898 A | 3/1994 | Dworsky et al. | |
| 5,382,930 A | 1/1995 | Stokes et al. | |
| 5,384,808 A | 1/1995 | Van Brunt et al. | |
| 5,448,014 A | 9/1995 | Kong et al. | |
| 5,465,725 A | 11/1995 | Seyed-Bolorforosh | |
| 5,587,620 A | 12/1996 | Ruby et al. | 310/346 |
| 5,589,858 A | 12/1996 | Kadowaki et al. | |
| 5,594,705 A | 1/1997 | Connor et al. | |
| 5,671,242 A | 9/1997 | Takiguchi et al. | |
| 5,692,279 A | 12/1997 | Mang et al. | |
| 5,714,917 A | 2/1998 | Ella | |
| 5,853,601 A | 12/1998 | Krishaswamy et al. | |
| 5,864,261 A | 1/1999 | Weber | 333/187 |
| 5,872,493 A * | 2/1999 | Ella | 333/191 |
| 5,873,153 A | 2/1999 | Ruby et al. | |
| 5,873,154 A * | 2/1999 | Ylilammi et al. | 29/25.35 |
| 5,910,756 A | 6/1999 | Ella | |
| 5,936,150 A | 8/1999 | Kobrin et al. | |
| 5,953,479 A | 9/1999 | Zhou et al. | |
| 5,982,297 A | 11/1999 | Welle | |
| 6,040,962 A | 3/2000 | Kanazawa | |
| 6,060,818 A | 5/2000 | Ruby et al. | |
| 6,087,198 A * | 7/2000 | Panasik | 438/51 |
| 6,107,721 A | 8/2000 | Lakin | 310/321 |
| 6,111,480 A | 8/2000 | Iyama et al. | |
| 6,124,756 A | 9/2000 | Yaklin et al. | |
| 6,150,703 A | 11/2000 | Cushman et al. | |
| 6,187,513 B1 | 2/2001 | Katakura | |
| 6,215,375 B1 | 4/2001 | Larson, III et al. | 333/187 |
| 6,228,675 B1 | 5/2001 | Ruby et al. | |
| 6,229,247 B1 | 5/2001 | Bishop | |
| 6,252,229 B1 | 6/2001 | Hays et al. | |
| 6,262,600 B1 | 7/2001 | Haigh et al. | |
| 6,262,637 B1 | 7/2001 | Bradley et al. | 333/133 |
| 6,265,246 B1 | 7/2001 | Ruby et al. | |
| 6,278,342 B1 * | 8/2001 | Ella | 333/189 |
| 6,292,336 B1 | 9/2001 | Horng et al. | |
| 6,307,447 B1 | 10/2001 | Barber et al. | |
| 6,376,280 B1 | 4/2002 | Ruby et al. | |
| 6,377,137 B1 | 4/2002 | Ruby | |
| 6,384,697 B1 | 5/2002 | Ruby | |
| 6,407,649 B1 | 6/2002 | Tikka et al. | |
| 6,414,569 B1 | 7/2002 | Nakafuku | |
| 6,420,820 B1 | 7/2002 | Larson, III | |
| 6,424,237 B1 | 7/2002 | Ruby et al. | |
| 6,429,511 B2 | 8/2002 | Ruby et al. | |
| 6,434,030 B1 | 8/2002 | Rehm et al. | |
| 6,437,482 B1 | 8/2002 | Shibata | |
| 6,441,539 B1 | 8/2002 | Kitamura et al. | |
| 6,462,631 B2 | 10/2002 | Bradley et al. | |
| 6,466,105 B1 | 10/2002 | Lobl et al. | 333/187 |
| 6,466,418 B1 | 10/2002 | Horng et al. | |
| 6,469,597 B2 | 10/2002 | Ruby et al. | |
| 6,472,954 B1 | 10/2002 | Ruby et al. | |
| 6,476,536 B1 | 11/2002 | Pensala | |
| 6,479,320 B1 | 11/2002 | Gooch | |
| 6,483,229 B2 | 11/2002 | Larson et al. | |
| 6,489,688 B1 | 12/2002 | Baumann et al. | |
| 6,492,883 B2 * | 12/2002 | Liang et al. | 333/132 |
| 6,507,983 B1 | 1/2003 | Ruby et al. | |
| 6,518,860 B2 | 2/2003 | Ella et al. | |
| 6,525,996 B1 | 2/2003 | Miyazawa | |
| 6,530,515 B1 | 3/2003 | Glenn et al. | |
| 6,534,900 B2 | 3/2003 | Aigner et al. | |
| 6,542,055 B1 | 4/2003 | Frank et al. | |
| 6,548,942 B1 * | 4/2003 | Panasik | 310/364 |
| 6,550,664 B2 | 4/2003 | Bradley et al. | |
| 6,564,448 B1 | 5/2003 | Oura et al. | |
| 6,566,979 B2 | 5/2003 | Larson et al. | |
| 6,583,374 B2 | 6/2003 | Knieser et al. | |
| 6,583,688 B2 | 6/2003 | Klee et al. | |
| 6,593,870 B2 | 7/2003 | Dummermuth et al. | |
| 6,600,390 B2 | 7/2003 | Frank | |
| 6,601,276 B2 | 8/2003 | Barber | |
| 6,617,249 B2 | 9/2003 | Ruby et al. | |
| 6,617,750 B2 | 9/2003 | Dummermuth et al. | |
| 6,630,753 B2 | 10/2003 | Malik et al. | |
| 6,635,509 B1 | 10/2003 | Ouellet | |
| 6,639,872 B1 | 10/2003 | Rein | |
| 6,651,488 B2 | 11/2003 | Larson et al. | |
| 6,657,363 B1 | 12/2003 | Aigner | |
| 6,668,618 B2 | 12/2003 | Larson et al. | |
| 6,670,866 B2 | 12/2003 | Ellaet et al. | 333/133 |
| 6,693,500 B2 | 2/2004 | Yang et al. | |
| 6,710,508 B2 | 3/2004 | Ruby et al. | |
| 6,710,681 B2 | 3/2004 | Figueredo et al. | |
| 6,714,102 B2 | 3/2004 | Ruby et al. | |
| 6,720,844 B1 | 4/2004 | Lakin | |
| 6,720,846 B2 | 4/2004 | Iwashita et al. | |
| 6,724,266 B2 | 4/2004 | Piazza et al. | |
| 6,777,263 B1 | 8/2004 | Gan et al. | |
| 6,787,048 B2 | 9/2004 | Bradley et al. | |
| 6,788,170 B1 | 9/2004 | Kaitila et al. | |
| 6,803,835 B2 | 10/2004 | Frank | |
| 6,812,619 B1 | 11/2004 | Kaitila et al. | |
| 6,828,713 B2 | 12/2004 | Bradley et al. | |
| 6,842,088 B2 | 1/2005 | Yamada et al. | |
| 6,873,065 B2 | 3/2005 | Haigh et al. | |
| 6,873,529 B2 | 3/2005 | Ikuta | |
| 6,874,211 B2 | 4/2005 | Bradley et al. | |
| 6,874,212 B2 | 4/2005 | Larson, III | |
| 6,888,424 B2 | 5/2005 | Takeuchi et al. | |
| 6,900,705 B2 | 5/2005 | Nakamura et al. | |
| 6,903,452 B2 | 6/2005 | Ma et al. | |
| 6,906,451 B2 | 6/2005 | Yamada et al. | |
| 6,911,708 B2 | 6/2005 | Park | |
| 6,917,261 B2 | 7/2005 | Unterberger | |
| 6,924,583 B2 | 8/2005 | Lin et al. | |
| 6,924,717 B2 | 8/2005 | Ginsburg et al. | |
| 6,927,651 B2 | 8/2005 | Larson, III et al. | |
| 6,936,928 B2 | 8/2005 | Hedler et al. | |
| 6,936,954 B2 | 8/2005 | Peczalski | |
| 6,946,928 B2 | 9/2005 | Larson, III et al. | |

| | | |
|---|---|---|
| 6,954,121 B2 | 10/2005 | Bradley et al. |
| 6,963,257 B2 | 11/2005 | Ella et al. |
| 6,975,183 B2 | 12/2005 | Aigner et al. |
| 6,977,563 B2 | 12/2005 | Komuro et al. |
| 6,985,052 B2 | 1/2006 | Tikka |
| 6,987,433 B2 | 1/2006 | Larson et al. |
| 6,989,723 B2 | 1/2006 | Komuro et al. |
| 6,998,940 B2 | 2/2006 | Metzger |
| 7,019,604 B2 | 3/2006 | Gotoh et al. |
| 7,019,605 B2 | 3/2006 | Larson, III |
| 7,057,476 B2 | 6/2006 | Hwu |
| 7,084,553 B2 | 8/2006 | Ludwiczak |
| 7,091,649 B2 | 8/2006 | Larson et al. |
| 7,098,758 B2 | 8/2006 | Wang et al. |
| 7,170,215 B2 | 1/2007 | Namba et al. |
| 7,173,504 B2 | 2/2007 | Larson |
| 7,187,254 B2 | 3/2007 | Su et al. |
| 7,230,509 B2 | 6/2007 | Stoemmer |
| 2002/0000646 A1 | 1/2002 | Gooch et al. |
| 2002/0030424 A1 | 3/2002 | Iwata |
| 2002/0121944 A1 | 9/2002 | Larson, III et al. |
| 2002/0121945 A1 | 9/2002 | Ruby et al. |
| 2002/0152803 A1 | 10/2002 | Larson, III et al. |
| 2002/0190814 A1 | 12/2002 | Yamada et al. |
| 2003/0001251 A1 | 1/2003 | Cheever et al. |
| 2003/0006502 A1 | 1/2003 | Karpman |
| 2003/0087469 A1 | 5/2003 | Ma |
| 2003/0102776 A1 | 6/2003 | Takeda et al. |
| 2003/0111439 A1 | 6/2003 | Fetter et al. |
| 2003/0128081 A1 | 7/2003 | Ella et al. |
| 2003/0132493 A1 | 7/2003 | Kang et al. |
| 2003/0141946 A1 | 7/2003 | Ruby et al. |
| 2003/0179053 A1 | 9/2003 | Aigner et al. |
| 2004/0092234 A1 | 5/2004 | Pohjonen |
| 2004/0124952 A1 | 7/2004 | Tikka |
| 2004/0150293 A1 | 8/2004 | Stoemmer |
| 2004/0150296 A1 | 8/2004 | Park et al. |
| 2004/0195937 A1 | 10/2004 | Matsubara et al. |
| 2004/0257172 A1 | 12/2004 | Schmidhammer et al. |
| 2004/0263287 A1 | 12/2004 | Ginsburg et al. |
| 2005/0012570 A1 | 1/2005 | Korden et al. |
| 2005/0023931 A1 | 2/2005 | Bouche et al. |
| 2005/0030126 A1 | 2/2005 | Inoue et al. |
| 2005/0036604 A1 | 2/2005 | Scott et al. |
| 2005/0057117 A1 | 3/2005 | Nakatsuka et al. |
| 2005/0057324 A1 | 3/2005 | Onishi et al. |
| 2005/0068124 A1* | 3/2005 | Stoemmer ............ 333/189 |
| 2005/0093396 A1 | 5/2005 | Larson et al. |
| 2005/0093653 A1 | 5/2005 | Larson, III |
| 2005/0093654 A1 | 5/2005 | Larson, III et al. |
| 2005/0093655 A1 | 5/2005 | Larson, III et al. |
| 2005/0093657 A1 | 5/2005 | Larson, III et al. |
| 2005/0093658 A1 | 5/2005 | Larson, III et al. |
| 2005/0093659 A1 | 5/2005 | Larson, III et al. |
| 2005/0104690 A1 | 5/2005 | Larson et al. |
| 2005/0110598 A1 | 5/2005 | Larson, III |
| 2005/0128030 A1 | 6/2005 | Larson et al. |
| 2005/0140466 A1 | 6/2005 | Larson, III et al. |
| 2005/0167795 A1 | 8/2005 | Higashi |
| 2005/0193507 A1 | 9/2005 | Ludwiczak |
| 2005/0206271 A1 | 9/2005 | Higuchi et al. |
| 2005/0218488 A1 | 10/2005 | Mie |
| 2006/0087199 A1 | 4/2006 | Larson et al. |
| 2006/0103492 A1 | 5/2006 | Feng et al. |
| 2006/0132262 A1 | 6/2006 | Fazzlo et al. |
| 2006/0164183 A1 | 7/2006 | Tikka |
| 2006/0185139 A1 | 8/2006 | Larson, III et al. |
| 2007/0085447 A1 | 4/2007 | Larson |
| 2007/0085631 A1 | 4/2007 | Larson et al. |
| 2007/0085632 A1 | 4/2007 | Larson et al. |
| 2007/0086080 A1 | 4/2007 | Larson et al. |
| 2007/0086274 A1 | 4/2007 | Nishimura et al. |
| 2007/0090892 A1 | 4/2007 | Larson |
| 2007/0170815 A1 | 7/2007 | Unkrich |
| 2007/0171002 A1 | 7/2007 | Unkrich |

FOREIGN PATENT DOCUMENTS

| | | |
|---|---|---|
| EP | 0 880 227 | 5/1998 |
| EP | 0865157 | 9/1998 |
| EP | 1 047 189 | 4/1999 |
| EP | 0973256 | 1/2000 |
| EP | 1 100 196 | 5/2001 |
| EP | 1096259 | 5/2001 |
| EP | 1100106 A2 | 5/2001 |
| EP | 1180494 | 2/2002 |
| EP | 1258990 | 11/2002 |
| EP | 1 542 362 | 6/2003 |
| EP | 1 557 945 | 10/2003 |
| EP | 1258989 | 1/2004 |
| EP | 1 517 444 | 8/2004 |
| EP | 1249932 | 3/2005 |
| EP | 1517443 | 3/2005 |
| EP | 1528674 | 5/2005 |
| EP | 1528675 | 5/2005 |
| EP | 1528677 | 5/2005 |
| EP | 1575165 | 9/2005 |
| GB | 1207974 | 10/1970 |
| GB | 2411239 | 8/2005 |
| GB | 2418791 | 4/2006 |
| JP | 2002-217676 | * 8/2002 |
| WO | WO 98/16957 | 4/1998 |
| WO | WO-01/06647 | 1/2001 |
| WO | WO-01/99276 | 12/2001 |
| WO | WO-02/103900 | 12/2002 |
| WO | WO-03/043188 | 5/2003 |
| WO | WO 03/050950 | 6/2003 |
| WO | WO 03/058809 | 7/2003 |
| WO | WO 2003/005880 | 7/2003 |
| WO | WO 03/030358 | 10/2003 |
| WO | WO 2004/034579 | 4/2004 |
| WO | WO-2004/051744 | 6/2004 |
| WO | WO-2005/043752 | 5/2005 |
| WO | WO-2005/043753 | 5/2005 |
| WO | WO-2005/043756 | 5/2005 |

OTHER PUBLICATIONS

Martin, et al., "Development of Low-Dielectric Constant Polymer for Fabrication of Integrated Circuit Interconnect", 12 Advanced Materials, pp. 1769-1778 (2000).

Lakin, K.M., "Bulk Acoustic Wave Coupled Resonator Filters", IEEE International Frequency Control Symposium and POA Exhibition, 2002, pp. 8-14, May 29-31, 2002.

Examination report from corresponding application number GB0605779.8 dated Aug. 23, 2006.

Examination report fro corresponding application number GB0605776.6 dated Aug. 30, 2006.

B. Hadimioglu et al., "Polymer Films As Acoustic Matching Layers", 1990 IEEE Ultrasonics Sysmposium Proceedings, vol. 3 pp. 1337-1340, Dec. 1990.

Jung, Jun-Phil, "Experimental and Theoretical INvestigation on the Relationship between AIN Properties and AIN-based FBAR Characteristics", IEEE Internations Frequency Control Symposium, May 4, 2003, pp. 779-784.

Lobl, H.P., et al., "Piezoelectric Material for BAW Resonators and Filters", IEEE Ultrasonics Symposium Oct. 5, 2003, pp. 807-811.

Yang, C.-M., Highly C-Axis-Oriented AIN Film Using MOCVD for 5GHz-Band FBAR Filter, IEEE Ultrasonics Symposium, Oct. 5, 2003, 99. 170-173.

Reinhardt, Alexandre et al., "Design of Coupled Resonator Filters Using Admittance and Scattering Matrices", 2003 IEEE Ultrasonics Symposium Oct. 5-8, 2003, vol. 2, pp. 1428-1431.

Examination Report from corresponding application number GB0605971.1 dated Aug. 24, 2006.

Examination Report corresponding to application No. Gb0605770.7 dated Aug. 25, 2006.

Holzlohner, Ronald et al., "Accurate Calculation of Eye Diagrams and Bit Error Rates In Optical Transmission Systems Using Linearization", Journal of Lightwave Technology, vol. 20, No. 3, (Mar. 2002), pp. 389-400.

Lakin, K.M. "Coupled Resonator Filters", 2002 IEEE Ultrasonics Symposium, (Mar. 2, 2002), pp. 901-908.

Lakin, K.M. et al., "High Performance Slacked Crystal Filters for GPS and Wide Bandwidth Applications", 2001 IEEE Ultrasonics Symposium, (Jan. 1, 2001), pp. 833-838.

U.S Appl. No. 10/971,169, filed Oct. 22, 2004, Larson, III, et al.

"Search report from corresponding application No.", GB0620152.9, (Nov. 15, 2006).

"Search report from corresponding application No.", GB0620655.1, (Nov. 17, 2006).

"Search report from corresponding application No.", GB0620653.6, (Nov. 17, 2006).

"Search Report from corresponding application No.", GB0620657.7, (Nov. 23, 2006).

Coombs, Clyde F., et al., "Electronic Instrument Handbook", *Second Edition, McGraw-Hill, Inc.*, (1995),pp. 5.1 to 5.29.

"A partial copy of GB Search Report for", *Application No. GB0522393.8*, (Jan. 9, 2006),4 pages.

"A partial copy of GB Search Report for Application No.", GB0525884.3, (Feb. 2, 2006),4 pgs.

Auld, B. A., "Acoustic Resonators", *Acoustic Fields and Waves in Solids, Second Edition, vol. II*, (1990),250-259.

"British Search Report Application No.", 0605222.9, (Jul. 11, 2006).

Tiersten, H. F., et al., "An Analysis of Thiskness-Extensional Trapped Energy Resonant Device Structures with Rectangular Electrodes in the Piezoelectric Thin Film on Silicon Configuration", *J. Appl. Phys. 54 (10)*, (Oct. 1983),5893-5910.

"Search Report from corresponding application", No. GB0605225.2, (Jun. 26, 2006).

"Search Report for Great Britian Patent Application", No. 0617742.2, (Mar. 29, 2007).

"Search Report for Great Britian Patent Application", No. 0617742.2, (Dec. 13, 2006).

"Search Report in the Great Britian Patent Application", No. 0619698.4, (Nov. 30, 2006).

Ruby, R. et al., "The Effect of Perimeter Geometry on FBAR Resonator Electrical Performance", *Microwave Symposium Digest, 2005 IEEE MTT-S International*, (Jun. 12, 2005),217-221.

Schuessler, Hans H., "Ceramic Filters and Resonators", *Reprinted from IEEE Trans. Sonics Ultrason., vol. SU-21*, (Oct. 1974),257-268.

Fattinger, G. G., et al., "Coupled Bulk Acoustic Wave Resonator Filters: Key technology for single-to-balanced RF filters", 0-7803-8331-1/4/W20.00; *IEEE MTT-S Digest*, (2004),927-929.

Choi, Sungjin et al., "Design of Half-Bridge Piezo-Transformer Converters in the AC Adapter Applications", *IEEE* 2005, 244-248.

Li, Yunxiu et al., "AC-DC Converter with Worldwide Range Input Voltage by Series and Parallel Piezoelectric Transformer Connection", *35th Annual IEEE Power Electronics Specialists Conference*, (2004).

Ivensky, Gregory et al., "A Comparison of Piezoelectric Transformer AC/DC Converters with Current Doubler and voltage Doubler Rectifiers", *IEEE Transactions on Power Electronics, vol. 19, No. 6.*, (Nov. 2004).

Navas, J. et al., "Miniaturised Battery Charger using Piezoelectric Transformers", *IEEE*, (2001),492-496.

Jiang, Yimin et al., "Novel Single-Phase Power Factor Correction Scheme", *IEEE*, (1993),287-292.

\* cited by examiner

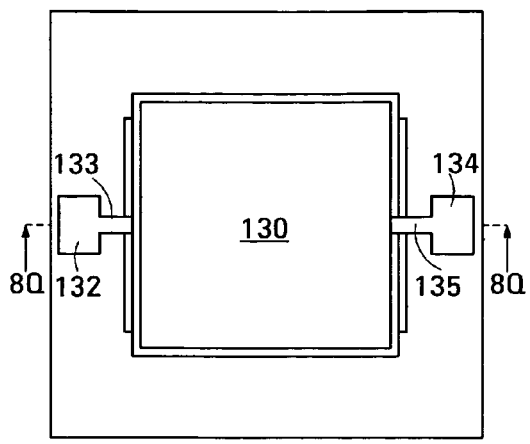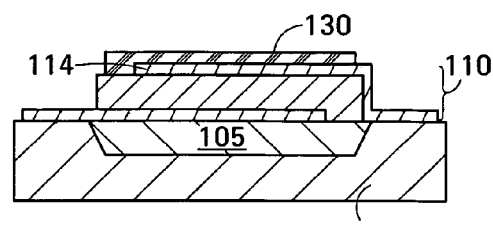
FIG. 8D          FIG. 8Q
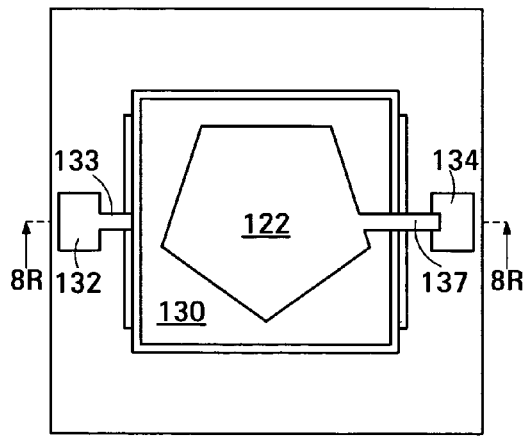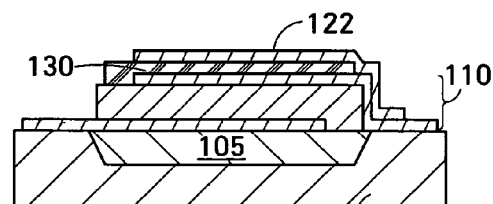
FIG. 8E          FIG. 8R
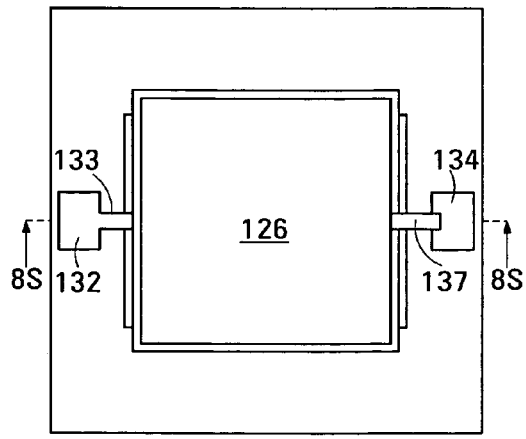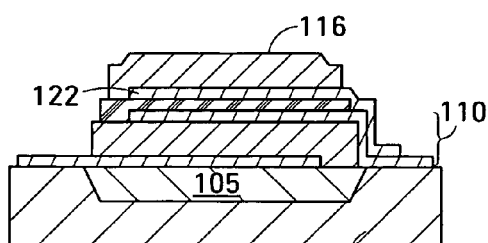
FIG. 8F          FIG. 8S

FILM BULK ACOUSTIC RESONATOR (FBAR) DEVICES WITH SIMPLIFIED PACKAGING

RELATED APPLICATION

This application is a Continuation-in-Part of the following U.S. patent applications: Ser. No. 10/699,289 filed Oct. 30, 2003 of John D. Larson III entitled Stacked Bulk Acoustic Resonator Band-Pass Filter with Controllable Pass Bandwidth (now U.S. Pat. No. 7,019,605), Ser. No. 10/699,481 filed Oct. 30, 2003 of John D. Larson III and Richard Ruby entitled Thin-Film Acoustically-Coupled Transformer (now U.S. Pat. No. 6,946,928), Ser. No. 10/965,541 filed Oct. 13, 2004 of John D. Larson III, Richard Ruby and Stephen Ellis entitled Decoupled Stacked Bulk Acoustic Resonator Band-Pass Filter with controllable Pass Bandwidth, and Ser. No. 10/965,637 filed Oct. 13, 2004 of John D. Larson III, Richard Ruby and Stephen Ellis entitled Film Acoustically-Coupled Transformer. The application is also related to U.S. patent application Ser. No. 10/969,744 filed Oct. 19, 2004 of John D. Larson III, Stephen Ellis, Paul L. Bradley and Yury Oshamyansky entitled Cavity-less Film Bulk Acoustic Resonator (FBAR) Devices, filed on the same day as this application. The above applications are all assigned to the assignee of this application and the disclosures of the above applications are incorporated into this application by reference.

BACKGROUND

FBAR devices that incorporate one or more film bulk acoustic resonators (FBARs) form part of an ever-widening variety of electronic products, especially wireless products. For example, modern cellular telephones incorporate a duplexer in which each of the band-pass filters includes a ladder circuit in which each element of the ladder circuit is an FBAR. A duplexer incorporating FBARs is disclosed by Bradley et al. in U.S. Pat. No. 6,262,637 entitled Duplexer Incorporating Thin-film Bulk Acoustic Resonators (FBARs), assigned to the assignee of this disclosure and incorporated into this disclosure by reference. Such duplexer is composed of a transmitter band-pass filter connected in series between the output of the transmitter and the antenna and a receiver band-pass filter connected in series with 90° phase-shifter between the antenna and the input of the receiver. The center frequencies of the pass-bands of the transmitter band-pass filter and the receiver band-pass filter are offset from one another. Ladder filters based on FBARs are also used in other applications.

FIG. 1 shows an exemplary embodiment of an FBAR-based band-pass filter 10 suitable for use as the transmitter band-pass filter of a duplexer. The transmitter band-pass filter is composed of series FBARs 12 and shunt FBARs 14 connected in a ladder circuit. Series FBARs 12 have a higher resonant frequency than shunt FBARs 14.

FIG. 2 shows an exemplary embodiment 30 of an FBAR. FBAR 30 is composed a pair of electrodes 32 and 34 and a piezoelectric element 36 between the electrodes. The piezoelectric element and electrodes are suspended over a cavity 44 defined in a substrate 42. This way of suspending the FBAR allows the FBAR to resonate mechanically in response to an electrical signal applied between the electrodes.

Above-mentioned U.S. patent application Ser. No. 10/699,289, of which this application is a Continuation-in-Part discloses a band-pass filter that incorporates a decoupled stacked bulk acoustic resonator (DSBAR) composed of a lower FBAR, an upper FBAR stacked on lower FBAR and an acoustic decoupler between the FBARs. Each of the FBARs is composed of a pair of electrodes and a piezoelectric element between the electrodes. An electrical input signal is applied between electrodes of the lower FBAR and the upper FBAR provides a band-pass filtered electrical output signal between its electrodes. The electrical input signal may alternatively be applied between the electrodes of the upper FBAR, in which case, the electrical output signal is taken from the electrodes of the lower FBAR.

Above-mentioned U.S. patent application Ser. No. 10/699,481, of which this disclosure is a Continuation-in-Part, discloses a film acoustically-coupled transformer (FACT) composed of two decoupled stacked bulk acoustic resonators (DSBARs). A first electrical circuit interconnects the lower FBARs of the DSBARs in series or in parallel. A second electrical circuit interconnects the upper FBARs of the DSBARs in series or in parallel. Balanced or unbalanced FACT embodiments having impedance transformation ratios of 1:1 or 1:4 can be obtained, depending on the configurations of the electrical circuits. Such FACTs also provide galvanic isolation between the first electrical circuit and the second electrical circuit.

The FBAR described above with reference to FIG. 2 and devices, such as ladder filters, DSBARs and FACTs, incorporating one or more FBARs will be referred to generically in this disclosure as FBAR devices.

Currently, the FBAR stacks of thousands of FBAR devices are fabricated at one time on a wafer of silicon or another suitable material. Each FBAR device additionally comprises a portion of the wafer as its substrate. An FBAR stack is composed of layers of various materials in which at least one FBAR is defined. FBAR devices are typically packaged in a package described by Merchant et al. in U.S. Pat. No. 6,090,687 assigned to the assignee of this disclosure and incorporated by reference. The wafer on which the FBAR stacks are fabricated will be referred to as an FBAR wafer. Each FBAR stack fabricated on the FBAR wafer is surrounded by an annular gasket located on the surface of the FBAR wafer. A cap wafer is then placed adjacent the FBAR wafer and is bonded to the gaskets. The FBAR wafer, the cap wafer and the gaskets and FBARs between the wafers constitute a wafer stack. The wafer stack is then singulated into individual encapsulated FBAR devices, an exemplary one of which is shown in cross-sectional view in FIG. 3.

FIG. 3 shows an encapsulated FBAR device 50 composed of an FBAR device 52 and a package 54. FBAR device is composed of an FBAR stack 56 and a substrate 58. Substrate 58 also constitutes part of package 54. FBAR stack 56 is composed of layers of various materials in which at least one FBAR is defined. FBAR stack 56 is suspended over a cavity 60 defined in substrate 58. Substrate 58 was part of the above-mentioned FBAR wafer prior to singulation. FBAR stack 56 is surrounded by an annular gasket 62 bonded to the major surface of substrate 58. Cap 64, which was part of the above-mentioned cap wafer prior to singulation, is bonded to gasket 62 opposite substrate 58. Substrate 58, gasket 62 and cap 64 collectively define a hermetically-sealed chamber 66 in which FBAR stack 56 is located.

As noted above, FBAR stack 56 is suspended over cavity 60 defined in substrate 58. The large mismatch between the acoustic impedances of the materials of FBAR stack 56 (typically tens of megarayleighs (Mrayl)) and the air or other gas in cavity 60 (about 1 kilorayleigh (krayl)) acoustically isolates FBAR stack 56 from substrate 58. Similarly, the top surface 68 of FBAR stack 56 remote from substrate 58 is separated from cap 64 by a gap 70. Gap 70 is typically filled with air or another gas. The large mismatch between the acoustic impedances of the materials of FBAR stack 56 and the air or other gas in gap 70 acoustically isolates FBAR stack 56 from cap 64. Thus, FBAR stack 56 is acoustically decoupled from both substrate 58 and cap 64 and is therefore free to resonate mechanically in response to an electrical signal applied between its electrodes.

While the package 54 of the encapsulated FBAR device 50 shown in FIG. 3 is relatively simple and inexpensive, simpler and less expensive packaging is available. One example of such packaging involves encapsulating the FBAR stack in an encapsulant (not shown) that covers the FBAR stack and part of the substrate. However, mechanical contact between the encapsulant and the top surface 68 of the FBAR stack remote from the substrate degrades the electrical properties of the encapsulated FBAR device because the FBAR stack is no longer free to resonate mechanically.

What is needed, therefore, is an encapsulated FBAR device in which the FBAR stack is effectively acoustically isolated from the encapsulant.

SUMMARY OF THE INVENTION

In a first aspect, the invention provides an encapsulated film bulk acoustic resonator (FBAR) device comprising a substrate, an FBAR stack over the substrate, an element for acoustically isolating the FBAR stack from the substrate, encapsulant covering the FBAR stack, and an acoustic Bragg reflector between the top surface of the FBAR stack and the encapsulant. The FBAR stack comprises an FBAR and has a top surface remote from the substrate. The FBAR comprises opposed planar electrodes and a piezoelectric element between the electrodes. The acoustic Bragg reflector comprises a metal Bragg layer and a plastic Bragg layer juxtaposed with the metal Bragg layer.

Examples of an FBAR device include an FBAR, such as an FBAR that provides an element of a ladder filter, a stacked bulk acoustic resonator (SBAR), a decoupled stacked bulk acoustic resonator (DSBAR), a band-pass filter, a coupled-resonator filter, and a film acoustically-coupled transformer (FACT).

The large ratio between the acoustic impedances of the metal of the metal Bragg layer and the plastic material of the plastic Bragg layer enables the acoustic Bragg reflector to provide sufficient acoustic isolation between the FBAR and the encapsulant for the frequency response of the FBAR device to exhibit minor, if any, spurious artifacts arising from undesirable acoustic coupling between the FBAR and the encapsulant.

The large ratio between the acoustic impedances of the metal of the metal Bragg layer and the plastic material of the plastic Bragg layer means that the FBAR device can typically be composed of between one and four Bragg layers in addition to the layers constituting the FBAR itself. This means that the fabrication process of the FBAR device in accordance with the invention is only slightly more complex than the fabrication process of a conventional FBAR device of the same type. The acoustic Bragg reflector allows a simpler and lower-cost process to be used to encapsulate the FBAR device.

The low velocity of sound in plastic materials means that the plastic Bragg layers are relatively thin. Accordingly, the overall height of the acoustic Bragg reflector acoustic is small.

In a second aspect, the invention provides an encapsulated film bulk acoustic resonator (FBAR) device comprising a substrate, an FBAR stack over the substrate, an element for acoustically isolating the FBAR stack from the substrate, encapsulant covering the FBAR stack, and an acoustic Bragg reflector between the top surface of the FBAR stack and the encapsulant. The FBAR stack comprises an FBAR and has a top surface remote from the substrate. The FBAR comprises opposed planar electrodes and a piezoelectric element between the electrodes. The acoustic Bragg reflector comprises a first Bragg layer and a second Bragg layer juxtaposed with the first Bragg layer. The first Bragg layer comprises a first material having an acoustic impedance less than five. The second Bragg layer comprises a second material having an acoustic impedance greater than 50. In an embodiment, the first material has an acoustic impedance less than three and the second material has an acoustic impedance greater than 60.

In a final aspect, the invention provides an encapsulated film bulk acoustic resonator (FBAR) device comprising a substrate, an FBAR stack over the substrate, an element for acoustically isolating the FBAR stack from the substrate, encapsulant covering the FBAR stack, and an acoustic Bragg reflector between the top surface of the FBAR stack and the encapsulant. The FBAR stack comprises an FBAR and has a top surface remote from the substrate. The FBAR comprises opposed planar electrodes and a piezoelectric element between the electrodes. The acoustic Bragg reflector comprises a first Bragg layer and a second Bragg layer juxtaposed with the first Bragg layer. The first Bragg layer comprises a first material having a first acoustic impedance and the second Bragg layer comprises a second material having a second acoustic impedance. The second acoustic impedance and the first acoustic impedance have a ratio greater than ten. In an embodiment, the second acoustic impedance and the first acoustic impedance have a ratio greater than 16.

BRIEF DESCRIPTION OF THE DRAWINGS

FIGS. 8A–8M are plan views illustrating a process for making an embodiment of an encapsulated FBAR device in accordance with the invention.

FIGS. 8N–8Z are cross-sectional views along the section lines 8N—8N through 8Z—8Z, respectively, in FIGS. 8A–8M, respectively.

DETAILED DESCRIPTION

Figure 1:
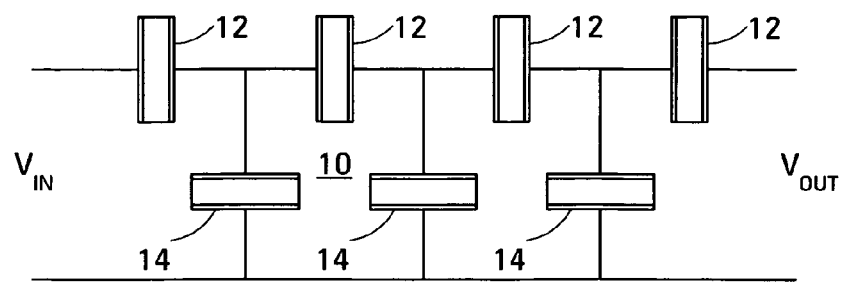
FIG. 1 is a schematic drawing of a ladder filter incorporating FBARs in accordance with the prior art.
Figure 2:
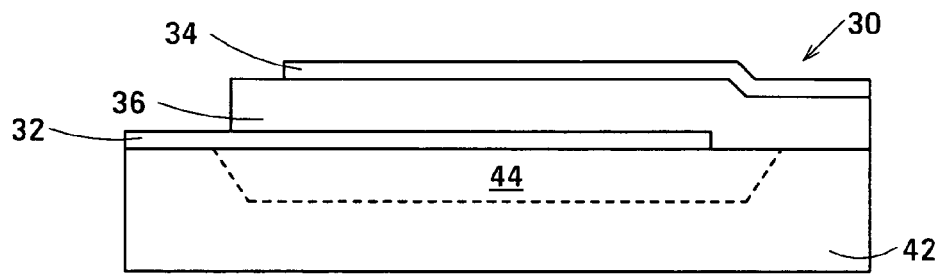
FIG. 2 is a cross-sectional view of an FBAR in accordance with the prior art.
Figure 4A:
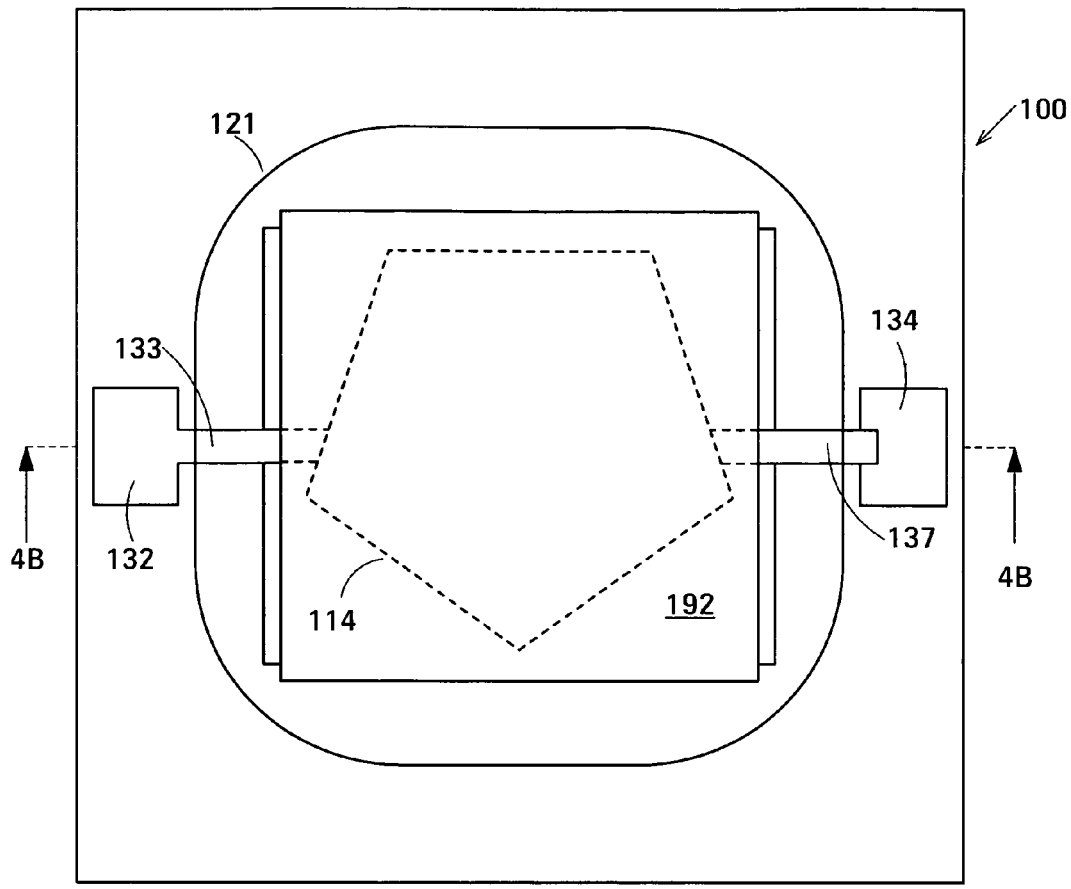
FIG. 4A is a plan view of a first embodiment of an encapsulated FBAR device in accordance with the invention.
Figure 4B:
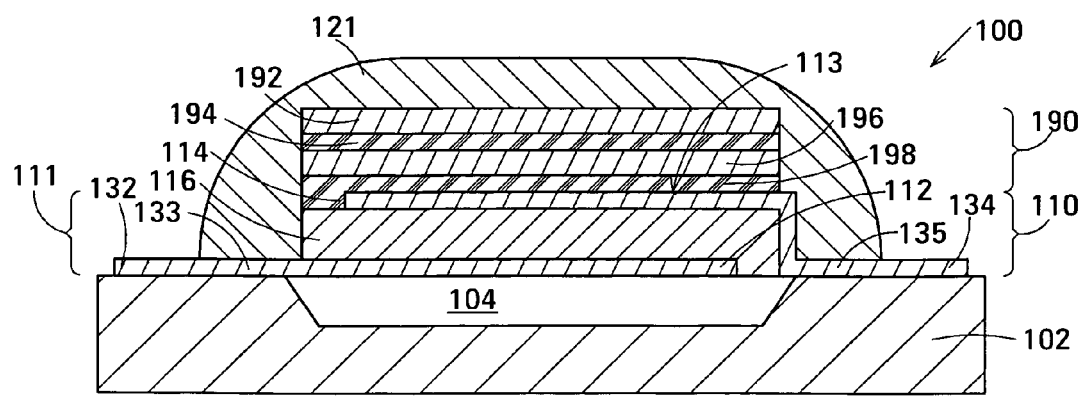
FIG. 4B is a cross-sectional view of the first embodiment of the encapsulated FBAR device shown in FIG. 4A along the section line 4B—4B.

FIGS. 4A and 4B are respectively a plan view and a cross-sectional view of a first exemplary embodiment 100 of an encapsulated FBAR device in accordance with the invention. Encapsulated FBAR device 100 comprises an FBAR stack 111 comprising FBAR 110. FBAR 110 is an exemplary FBAR of an FBAR ladder filter, such as that shown in FIG. 1, or an exemplary FBAR of a duplexer. The remaining FBARs of such ladder filter or duplexer also constitute part of FBAR stack 111. However, the remaining FBARs are omitted from FIGS. 4A and 4B to simplify the drawing.

Referring to FIG. 4B, encapsulated FBAR device 100 is composed of a substrate 102, an FBAR stack 111 over the substrate, an element that isolates the FBAR stack from the substrate, encapsulant 121 covering FBAR stack 111, and an acoustic Bragg reflector 190 between the top surface 113 of FBAR stack 111 and encapsulant 121. Acoustic Bragg reflector 190 comprises a first metal Bragg layer 192 juxtaposed with a first plastic Bragg layer 194. In the example shown, first metal Bragg layer 192 is juxtaposed with encapsulant 121 and acoustic Bragg reflector 190 is additionally composed of a second metal Bragg layer 196 juxtaposed with first plastic Bragg layer 194 and a second plastic Bragg layer 198 juxtaposed with second metal Bragg layer 196. Second plastic Bragg layer 198 is juxtaposed with the top surface 113 of FBAR stack 111. Also in the example shown, FBAR stack 111 is composed of a single FBAR device 110 having opposed planar electrodes 112 and 114 and a piezoelectric element 116 between the electrodes.

Also in the example shown, cavity 104 defined in substrate 102 performs the function of acoustically isolating FBAR stack 111 from substrate 102. Additionally, acoustic Bragg reflector 190 acoustically isolates the FBAR stack from encapsulant 121. Thus, FBAR stack 111 is acoustically isolated both from substrate 102 and from encapsulant 121 and is therefore free to vibrate mechanically in response to an electrical signal applied between the electrodes 112 and 114 of FBAR 110.

Bragg layers described in this disclosure as juxtaposed typically physically contact one another as shown in FIG. 4B. However, juxtaposed Bragg layers may be separated by intervening layers provided such intervening layers have a negligible effect on the acoustical properties of the juxtaposed Bragg layers.

An element described herein as being over another element typically physically contacts one other element, as does remote-side electrode 114 and piezoelectric element 116. However, an element described as over another element may alternatively be separated from such other element by one or more other elements. For example, piezoelectric element 116 may be described as being over substrate 102, but is separated from the substrate by electrode 112 in the embodiment shown in FIG. 4B.

As used in this disclosure, the term FBAR stack refers to a stack of layers of various materials that comprises one or more FBARs. In embodiments in which the FBAR stack comprises more than one FBAR, the FBARs may be at the same level in the FBAR stack or at different levels in the FBAR stack, or some of the FBARs may be at the same level in the FBAR stack and some of the FBARs may be at different levels in the FBAR stack. For example, the FBARs in an FBAR ladder filter are typically at the same level in the FBAR stack, the FBARs in a decoupled stacked bulk acoustic resonator (DSBAR) are at different levels in the FBAR stack and some of the FBARs of a thin-film acoustically-coupled transformer (FACT) are at the same level in the FBAR stack and some of the FBARs of the FACT are at different levels in the FBAR stack.

Encapsulated FBAR device 100 has a band-pass frequency response characteristic having a center frequency. As used in this disclosure, the term Bragg layer refers to a layer having a nominal thickness t of an odd integral multiple of one quarter of the wavelength $\lambda_n$ in the material of the Bragg layer of an acoustic signal equal in frequency of the center frequency, i.e., $t=(2m+1)\lambda_n/4$, where m is an integer greater than or equal to zero. Bragg layers in which the integer m is zero typically reduce the likelihood of the frequency response of the encapsulated FBAR device exhibiting spurious artifacts. In such Bragg layers, the nominal thickness of the Bragg layer is one quarter of the wavelength in the material of the layer of the above-mentioned acoustic signal, i.e., $t=\lambda_n/4$. A layer of this thickness will be referred to as a quarter-wave layer. Moreover, as will be described in more detail below, embodiments in which at least the metal Bragg layers are thinner than quarter-wave layers, some as thin as $\lambda_n/16$, will give sufficient acoustic isolation for use in many applications.

The inventors have discovered that the acoustic isolation provided by an acoustic Bragg reflector depends on the ratio of the acoustic impedances of the materials of the Bragg layers constituting the acoustic Bragg reflector. The effective acoustic impedance $Z_{eff1}$ presented by a first Bragg layer juxtaposed with another layer is the acoustic impedance seen at the surface of the first Bragg layer remote from the other layer. The effective acoustic impedance presented by the first Bragg layer depends on the acoustic impedance of the first Bragg layer and the effective acoustic impedance presented to the first Bragg layer by the other layer. The effective acoustic impedance presented by the first Bragg layer is given by:

$$Z_{eff1}=Z_p^2/Z_m \quad (1)$$

where $Z_p$ is the acoustic impedance of the material of the first Bragg layer and $Z_m$ is the acoustic impedance of the other layer.

For example, the effective acoustic impedance at the surface of first metal Bragg layer 192 remote from encapsulant 121 depends on the acoustic impedance of the material of first metal Bragg layer 192 and the acoustic impedance of the material of the encapsulant. In this example, $Z_{eff1}$ is the effective acoustic impedance presented at the surface of first metal Bragg layer 192 remote from encapsulant 121, $Z_p$ is the acoustic impedance of the material of first metal Bragg layer 192 and $Z_m$ is the acoustic impedance of the material of encapsulant 121.

The relationship defined by equation (1) exists between each Bragg layer and the preceding Bragg layer. In equation (1), $Z_m$ is the effective acoustic impedance presented to the Bragg layer by the preceding Bragg layer.

For example, first metal Bragg layer 192 presents effective acoustic impedance $Z_{eff1}$ to first plastic Bragg layer 194. First plastic Bragg layer 194 transforms the effective acoustic impedance $Z_{eff1}$ to another effective acoustic impedance $Z_{eff2}$, and presents effective acoustic impedance $Z_{eff2}$ to second metal Bragg layer 196. Second metal Bragg layer 196 transforms the effective acoustic impedance $Z_{eff2}$ to another effective acoustic impedance $Z_{eff3}$, and presents effective acoustic impedance $Z_{eff3}$ to second plastic Bragg layer 198. Second plastic Bragg layer 198 transforms the effective acoustic impedance $Z_{eff3}$ to another effective acoustic impedance $Z_{eff4}$, and presents effective acoustic impedance $Z_{eff4}$ to FBAR 110. Effective acoustic impedance $Z_{eff4}$ is also the effective acoustic impedance of acoustic Bragg reflector 190.

The acoustic impedance mis-match between FBAR stack 111 and the effective acoustic impedance presented by acoustic Bragg reflector 190 at second plastic Bragg layer 198 provides the acoustic isolation between FBAR stack 111 and encapsulant 121. The effective acoustic impedances presented by Bragg layers 192, 194, 196 and 198, respectively, alternate between high and low, the high impedance increasing and the low impedance decreasing, from first metal Bragg layer 192 to second plastic Bragg layer 198.

For acoustic Bragg reflector 190 to provide effective acoustic isolation, the effective acoustic impedance it presents to FBAR stack 111 may be greater than or less than the acoustic impedance of the FBAR stack. The acoustic isolation provided by acoustic Bragg reflector 190 may be quantified by the absolute value of the ratio of the effective acoustic impedance of acoustic Bragg reflector 190 and the acoustic impedance of FBAR stack 111 expressed in decibels (20 times the logarithm of the ratio). Increasing the acoustic isolation reduces the likelihood that the frequency response of FBAR device 100 will exhibit undesirable spurious artifacts due to unwanted acoustic coupling between FBAR stack 111 and encapsulant 121.

In accordance with the invention, materials of alternate ones of the Bragg layers of acoustic Bragg reflector 190 are respectively a plastic material and metal, especially a refractory metal such as tungsten or molybdenum. The large ratio between the acoustic impedances of metals and plastic materials enables an acoustic isolation of many tens of decibels to be obtained using relatively few Bragg layers. Several refractory metals are available that have an acoustic impedance of greater than 50 Mrayl and that are compatible with the etchants used in typical FBAR fabrication processes. Molybdenum, for example, has an acoustic impedance of about 63 Mrayl. Several plastic materials are available that have an acoustic impedance of less than 5 Mrayl and that are compatible with the high temperatures and etchants used in typical FBAR fabrication processes. The acoustic impedances of some such plastic materials are as low as about 2 Mrayl. Thus, several combinations of metals and plastics having an acoustic impedance ratio greater than ten are available. Molybdenum and a crosslinked polyphenylene polymer that will be described below have an acoustic impedance ratio of about 30.

Plastic materials compatible with the high temperatures (>400° C.) and etchants to which first plastic Bragg layer 194 and second plastic Bragg layer 198 are subject during deposition of first metal Bragg layer 192 and second metal Bragg layer 196 are available with acoustic impedances in the range from about 2 Mrayl to about 4 Mrayl.

Figure 3:
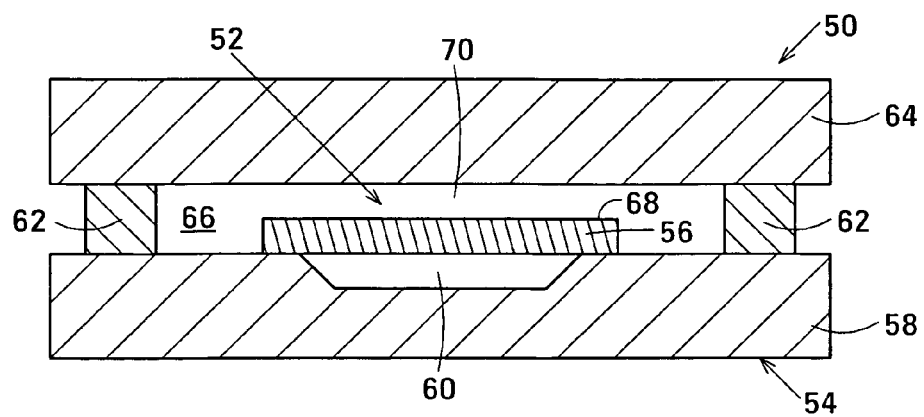
FIG. 3 is a cross-sectional view of an encapsulated FBAR device in accordance with the prior art.

Using metal, such as a refractory metal, with an acoustic impedance greater than about 50 Mrayl as the material of first metal Bragg layer 192 and second metal Bragg layer 196, and plastic material having an acoustic impedance of less than about 5 Mrayl as the material of first plastic Bragg layer 194 and second plastic Bragg layer 198 result in an embodiment of acoustic Bragg reflector 190 that presents an effective acoustic impedance of about 400 rayleighs (rayl) to FBAR stack 111. Assuming that FBAR stack 111 has an effective acoustic impedance of about 50 Mrayl, this results in an acoustic isolation of over 100 dB. Acoustic Bragg reflector 190 provides sufficient acoustic isolation between FBAR stack 111 and encapsulant 121 for the frequency response of FBAR 110 to have a frequency response substantially free of spurious artifacts. Embodiments in which the plastic material has an acoustic impedance of about 2 Mrayl provide a calculated acoustic isolation of over 120 dB. For comparison, the calculated acoustic isolation provided by gap 70 shown in FIG. 3 is less than about 90 dB. The gas in the gap has an acoustic impedance of about 1 krayl.

Embodiments requiring even greater acoustic isolation between FBAR stack 111 and encapsulant 121 can have additional pairs of Bragg layers of plastic and metal between first metal Bragg layer 192 and encapsulant 121. However, the acoustic isolation provided by the illustrated embodiment of acoustic Bragg reflector 190 is sufficient for most applications.

Electrode 112, electrode 114 and piezoelectric layer 116 form a mechanical structure having a mechanical resonance that defines the center frequency of the pass-band of FBAR 110. Electrode 112, electrode 114 and piezoelectric element 116 are similar in thickness to the corresponding elements of a conventional FBAR whose band-pass frequency response has the same nominal center frequency. As a result, encapsulated FBAR device 100 has electrical characteristics similar to those of a similar conventional FBAR device, such as that shown in FIG. 3, in which the top of the FBAR stack is isolated from the package by a gap.

Encapsulated FBAR device 100 additionally has a terminal pad 132, a terminal pad 134, an electrical trace 133 that electrically connects terminal pad 132 to electrode 112, and an electrical trace 135 that electrically connects terminal pad 134 to electrode 114. Terminal pads 132 and 134 are used to make electrical connections from encapsulated FBAR device 100 to external electrical circuits (not shown).

As will be described below, fabrication of the FBAR stack 111 and acoustic Bragg reflector 190 of encapsulated FBAR device 100 is somewhat more complex than fabrication of the FBAR stack 56 of the conventional gap-isolated encapsulated FBAR device shown in FIG. 3 due to the need to form acoustic Bragg reflector 190 by depositing and patterning additional layers of material on the top surface 113 of FBAR stack 111. On the other hand, FBAR device 100 is encapsulated simply by covering FBAR stack 111 and acoustic Bragg reflector 190 with encapsulant material and curing the encapsulant material to form encapsulant 121. In one embodiment, the encapsulant material is polyimide, described in more detail below. In other embodiments, the encapsulant material is a room-temperature vulcanizing rubber (RTV), a glass-loaded epoxy or another suitable encapsulant material. In applications in which hermetic encapsulation is desirable, encapsulant 121 may additionally comprise a thin sealing layer of metal (not shown) applied as a coating to the external surface of the cured encapsulant material. Suitable metals include aluminum and gold. The additional metal sealing layer substantially reduces the porosity of encapsulant 121.

FBAR stack 111 may be covered by an encapsulant different from encapsulant 121. For example, a low-profile embodiment of package 54 shown in FIG. 3 in which cap 64 contacts acoustic Bragg reflector 190 may provide an encapsulant covering FBAR stack 111.

In embodiments of the encapsulated FBAR devices described in this disclosure, the plastic material of the plastic Bragg layers is polyimide. Polyimide is sold under the trademark Kapton® by E. I. du Pont de Nemours and Company. In such embodiments, plastic Bragg layers 194 and 198 are each composed of polyimide applied by spin coating. Polyimide has an acoustic impedance of about 4 Mrayl.

In other embodiments, the plastic material of the plastic Bragg layers is a poly(para-xylylene). In such embodiments, plastic Bragg layers 194 and 198 are each composed of poly(para-xylylene) applied by vacuum deposition. Poly (para-xylylene) is also known in the art as parylene. The dimer precursor di-para-xylylene from which parylene is made and equipment for performing vacuum deposition of layers of parylene are available from many suppliers. Parylene has an acoustic impedance of about 2.8 Mrayl.

In further embodiments, the plastic material of the plastic Bragg layers is a crosslinked polyphenylene polymer. In such embodiments, plastic Bragg layers 194 and 198 are each composed of the crosslinked polyphenylene polymer applied by spin coating. Crosslinked polyphenylene polymers have been developed as low dielectric constant dielectric materials for use in integrated circuits and consequently remain stable at the high temperatures to which the crosslinked polyphenylene polymer is subject during the subsequent deposition and patterning of the metal Bragg layers of acoustic Bragg reflector 190. The inventors have discovered that crosslinked polyphenylene polymers additionally have a calculated acoustic impedance of about 2 Mrayl. The low acoustic impedance of crosslinked polyphenylene polymers enables embodiments of acoustic Bragg reflector 190 in which the plastic material of the plastic Bragg layers is a crosslinked polyphenylene polymer to provide an especially high acoustic isolation.

Precursor solutions containing various oligomers that polymerize to form respective crosslinked polyphenylene polymers are sold by The Dow Chemical Company, Midland, Mich., under the trademark SiLK. The precursor solutions are applied by spin coating. The crosslinked polyphenylene polymer obtained from one of these precursor solutions designated SiLK™ J, which additionally contains an adhesion promoter, has a calculated acoustic impedance of 2.1 Mrayl, i.e., about 2 Mrayl.

The oligomers that polymerize to form crosslinked polyphenylene polymers are prepared from biscyclopentadienone- and aromatic acetylene-containing monomers. Using such monomers forms soluble oligomers without the need for undue substitution. The precursor solution contains a specific oligomer dissolved in gamma-butyrolactone and cyclohexanone solvents. The percentage of the oligomer in the precursor solution determines the layer thickness when the precursor solution is spun on. After application, applying heat evaporates the solvents and then cures the oligomer to form a cross-linked polymer. The biscyclopentadienones react with the acetylenes in a 4+2 cycloaddition reaction that forms a new aromatic ring. Further curing results in the cross-linked polyphenylene polymer. The above-described crosslinked polyphenylene polymers are disclosed by Godschalx et al. in U.S. Pat. No. 5,965,679, incorporated herein by reference. Additional practical details are described by Martin et al., Development of Low-Dielectric Constant Polymer for the Fabrication of Integrated Circuit Interconnect, 12 ADVANCED MATERIALS, 1769 (2000), also incorporated by reference. Compared with polyimide, crosslinked polyphenylene polymers have a lower acoustic impedance, a lower acoustic attenuation and a lower dielectric constant. Moreover, a spun-on layer of the precursor solution is capable of producing a high-quality film of the crosslinked polyphenylene polymer with a thickness of the order of 200 nm, which is a typical thickness of plastic Bragg layers 194 and 198.

Each of the Bragg layers 192, 194, 196 and 198 has a nominal thickness of one quarter of the wavelength in the material of the Bragg layer of an acoustic signal equal in frequency to the center frequency of the pass band of FBAR 110. With quarter-wave thick Bragg layers, acoustic Bragg reflector 190 presents a calculated effective acoustic impedance of about 65 rayl with polyimide plastic Bragg layers and about 4 rayl with crosslinked polyphenylene polymer plastic Bragg layers. These acoustic impedances correspond to acoustic isolations of about 118 dB and 142 dB, respectively.

In an embodiment of acoustic Bragg reflector 190 structured to operate at about 2 GHz in which the plastic material of the plastic Bragg layers 194 and 198 is crosslinked polyphenylene polymer and the metal of the metal Bragg layers 192 and 196 is molybdenum, the thickness of the plastic Bragg layers is about 190 nm and the thickness of the metal Bragg layers is about 800 nm. Precursor solutions for crosslinked polyphenylene polymers formulated to spin on with a thickness of about 190 nm are commercially available. Polyimide can also be spun on in layers of this thickness. Accordingly, forming plastic Bragg layers 194 and 198 as nominal quarter-wave layers is straightforward. On the other hand, sputter depositing molybdenum to a thickness of 800 nm with high material quality and patterning such a layer is difficult to do using current production technology. However, the large effective acoustic impedance transformation obtained by juxtaposing a plastic Bragg layer with a refractory metal Bragg layer means that an adequately-large acoustic isolation can be obtained with metal Bragg layers that are substantially thinner than quarter-wave layers. Test structures using metal Bragg layers as thin as 220 nm (just thicker than sixteenth-wave layers) produce acceptable results. Using metal Bragg layers about 300 nm, equal in thickness to the electrodes 112 and 114 of FBAR 110, produces good results.

Using metal Bragg layers thinner than quarter-wave layers in acoustic Bragg reflector 190 produces a greater proportional reduction in the acoustic isolation as the number of Bragg layers is reduced. Using current manufacturing technology, better results and lower costs are typically obtained using more Bragg layers in which the metal Bragg layers are thinner than quarter-wave layers than using fewer Bragg layers in which the metal Bragg layers are quarter-wave layers.

Figure 4C:
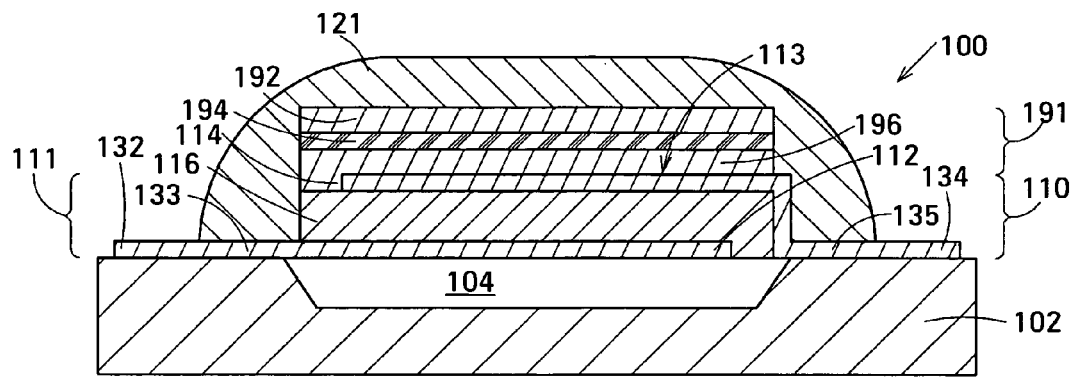
FIGS. 4C and 4D are cross-sectional views of alternative structures of the acoustic Bragg reflector of the encapsulated FBAR device shown in FIG. 4A.
Figure 4D:
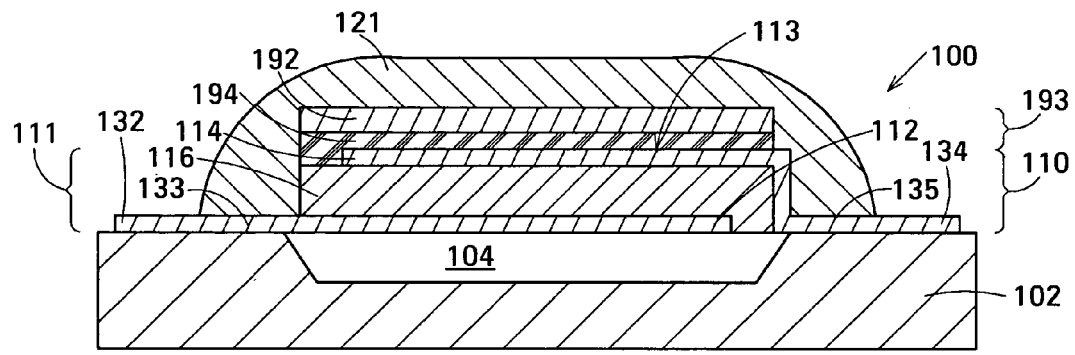

FIGS. 4C and 4D are cross-sectional views of simplified examples of encapsulated FBAR device 100 in accordance with the invention in which the acoustic Bragg reflector is composed of fewer Bragg layers than acoustic Bragg reflector 190 shown in FIG. 4B. The encapsulated FBAR devices shown in FIGS. 4C–4D are similar in plan view to encapsulated FBAR device 100 shown in FIG. 4A.

In the encapsulated FBAR device shown in FIG. 4C, second plastic Bragg layer 198 (FIG. 4B) is omitted and acoustic Bragg reflector 191 is composed of first metal Bragg layer 192 juxtaposed with first plastic Bragg layer 194 and second metal Bragg layer 196 juxtaposed with first plastic Bragg layer 194. Second metal Bragg layer 196 is juxtaposed with the top surface 113 of FBAR stack 111, i.e., with electrode 114. Electrode 114 may be electrically isolated from second metal Bragg layer 196 by an insulating layer substantially thinner than a quarter-wave layer. With quarter-wave thick Bragg layers, acoustic Bragg reflector 191 presents a calculated effective acoustic impedance of about 25 Grayl with polyimide plastic Bragg layers and about 99 Grayl with crosslinked polyphenylene polymer plastic Bragg layers. These acoustic impedances correspond to acoustic isolations of about 74 dB and 86 dB, respectively.

In the encapsulated FBAR device shown in FIG. 4D, second plastic Bragg layer 198 and second metal Bragg layer 196 (FIG. 4B) are omitted and acoustic Bragg reflector 193 is composed of first metal Bragg layer 192 juxtaposed with first plastic Bragg layer 194. First plastic Bragg layer 194 is juxtaposed with the top surface 113 of FBAR stack 111. With quarter-wave thick Bragg layers, acoustic Bragg reflector 193 presents a calculated effective acoustic impedance of about 16 krayl with polyimide plastic Bragg layers and about 4 krayl with crosslinked polyphenylene polymer plastic Bragg layers. These acoustic impedances correspond to acoustic isolations of about 70 dB and 82 dB, respectively.

Figure 5:
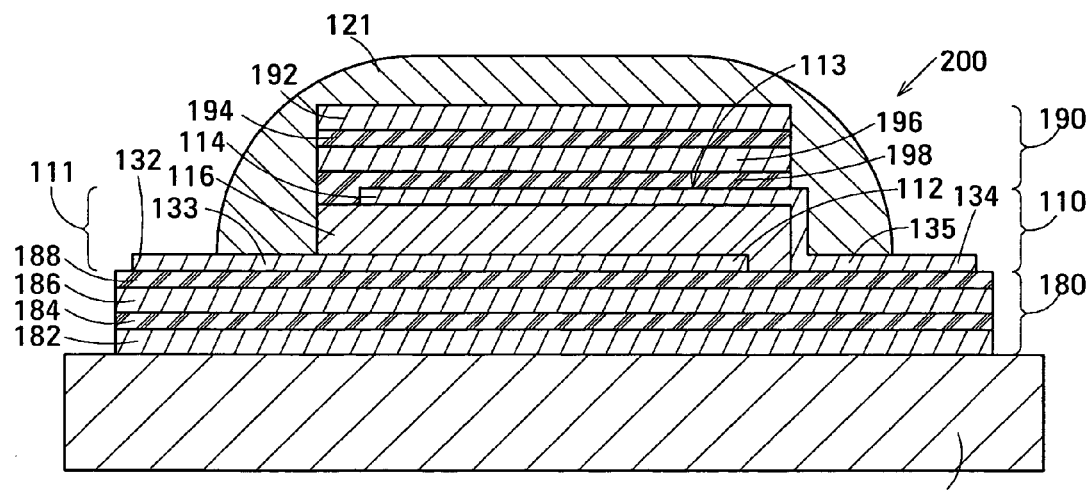
FIG. 5 is a cross-sectional view of a second embodiment of an encapsulated FBAR device in accordance with the invention.

FIG. 5 is a cross-sectional view of a second exemplary embodiment 200 of an encapsulated FBAR device in accordance with the invention. Encapsulated FBAR device 200 is similar in plan view to encapsulated FBAR device 100 shown in FIG. 4A. Encapsulated FBAR device 200 comprises FBAR stack 111 comprising FBAR 110. FBAR 110 is an exemplary FBAR of an FBAR ladder filter, such as that shown in FIG. 1, or an exemplary FBAR of a duplexer. The remaining FBARs of such ladder filter or duplexer also constitute part of FBAR stack 111. However, the remaining FBARs are omitted from FIG. 5 to simplify the drawing. Elements of encapsulated FBAR device 200 that correspond to elements of encapsulated FBAR device 100 described above with reference to FIGS. 4A and 4B are indicated using the same reference numerals and will not be described in detail again here.

Encapsulated FBAR device 200 is composed of substrate 102, FBAR stack 111 over the substrate, an element that isolates the FBAR stack from the substrate, encapsulant 121 covering FBAR stack 111, and acoustic Bragg reflector 190 between the top surface 113 of FBAR stack 111 and encapsulant 121. Acoustic Bragg reflector 190 comprises first metal Bragg layer 192 juxtaposed with first plastic Bragg layer 194. In the example shown, first metal Bragg layer 192 juxtaposed with encapsulant 121 and acoustic Bragg reflector 190 is additionally composed of second metal Bragg layer 196 juxtaposed with first plastic Bragg layer 194 and second plastic Bragg layer 198 juxtaposed with second metal Bragg layer 196. Second plastic Bragg layer 198 is juxtaposed with the top surface 113 of FBAR stack 111. Also in the example shown, FBAR stack 111 is composed of a single FBAR device 110 having opposed planar electrodes 112 and 114 and piezoelectric element 116 between the electrodes.

In the FBAR device, an acoustic Bragg reflector 180 located between FBAR stack 111 and substrate 102 performs the functional of acoustically isolating FBAR stack 111 from substrate 102 as described in the above mentioned U.S. patent application Ser. No. 10/969,744 entitled Cavity-less Film Bulk Acoustic Resonator Devices. Additionally, acoustic Bragg reflector 190 isolates FBAR stack from encapsulant 121 as described above. Thus, FBAR stack ill is acoustically isolated from both substrate 102 and from encapsulant 121 and is therefore free to vibrate in response to an electrical signal applied between electrodes 112 and 114 of FBAR 110.

Acoustic Bragg reflector 180 comprises a first metal Bragg layer 182 juxtaposed with a first plastic Bragg layer 184. In the example shown, first metal Bragg layer 182 is juxtaposed with the substrate and acoustic Bragg reflector 180 is additionally composed of a second metal Bragg layer 186 juxtaposed with first plastic Bragg layer 184 and a second plastic Bragg layer 188 juxtaposed with second metal Bragg layer 186.

The materials of metal Bragg layers 182 and 186 are typically the same as those of metal Bragg layers 192 and 196 described above, although different materials may be used. The materials of plastic Bragg layers 184 and 188 are typically the same as those of metal Bragg layers 194 and 198 described above, although different materials may be used. Bragg layers 182, 184, 186 and 188 are nominally quarter-wave layers. However, similar to metal Bragg layers 192 and 196, metal Bragg layers 182 and 186 are typically thinner than quarter-wave layers for ease of fabrication.

Similar to acoustic Bragg reflector 190, acoustic Bragg reflector 180 may be composed of more or fewer Bragg layers than the number exemplified in FIG. 5. Either or both of second metal Bragg layer 186 and second plastic Bragg layer 186 may be omitted in a manner similar to that described above with reference to FIGS. 4C and 4D. Moreover, typical materials of substrate 102 have a higher acoustic impedance than encapsulant 121 so that effective acoustic isolation from substrate 102 can be obtained by reversing the order of first metal Bragg layer 182 and first plastic Bragg layer 184 to juxtapose first plastic Bragg layer 184 with substrate 102. Thus, another embodiment of acoustic Bragg reflector 180 is composed simply of first metal Bragg layer 182 and first plastic Bragg layer 184 with first plastic Bragg layer 184 juxtaposed with substrate 102 and first metal Bragg layer 182 juxtaposed with FBAR stack 111. In a further embodiment, second plastic Bragg layer 186 is interposed between first metal Bragg layer 182 and FBAR stack 111. In a yet further embodiment, second plastic Bragg layer 186 and second metal Bragg layer 188 are interposed in order between first metal Bragg layer 182 and FBAR stack 111.

Unlike encapsulated FBAR device 100, encapsulated FBAR device 200 does not need that a release etch be performed towards the end of the fabrication process to remove sacrificial material from cavity 104 in the substrate 102 of FBAR device 100. Not having to perform a release etch increases the range of materials that can be used to fabricate FBAR device 200 because the materials do not have to be compatible with a release etch.

FBAR device 200 additionally has a terminal pad 132, a terminal pad 134, an electrical trace 133 that electrically connects terminal pad 132 to electrode 112, and an electrical trace 135 that electrically connects terminal pad 134 to electrode 114. Terminal pads 132 and 134 are used to make electrical connections from FBAR device 200 to external electrical circuits (not shown).

Figure 6A:
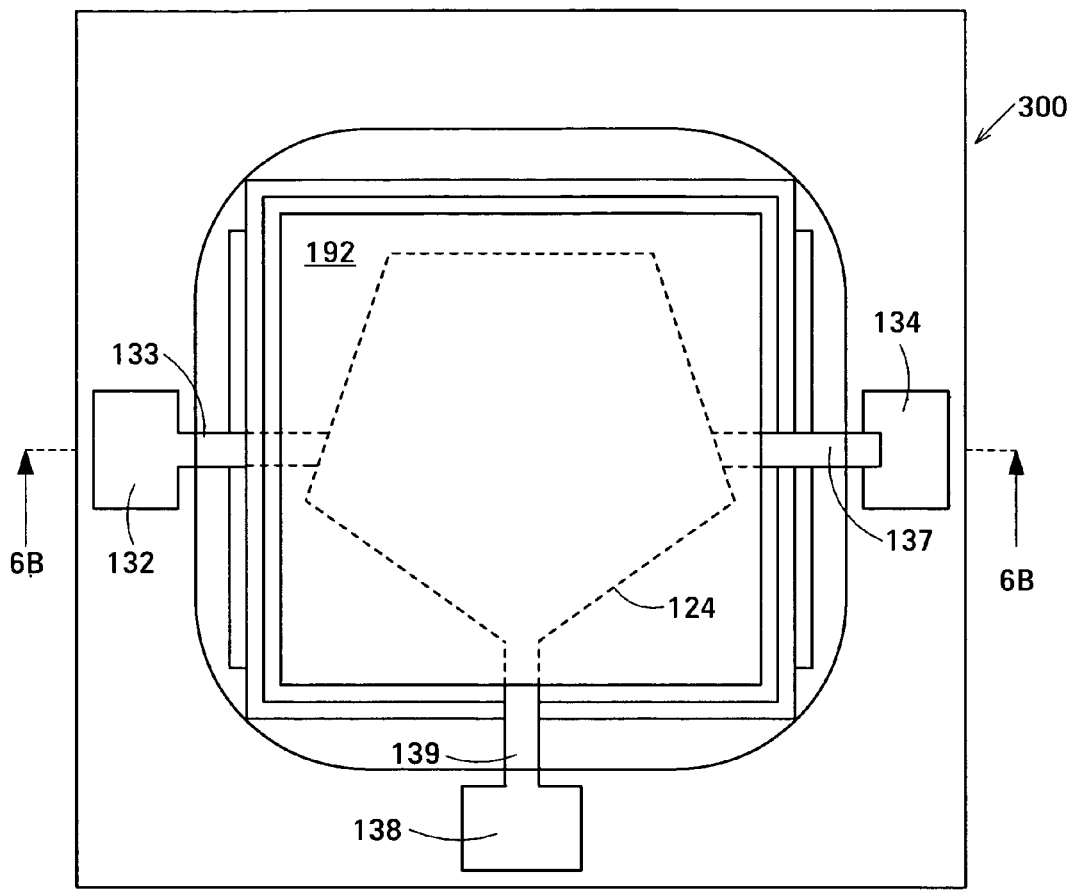
FIG. 6A is a plan view of a third embodiment of an encapsulated FBAR device in accordance with the invention.
Figure 6B:
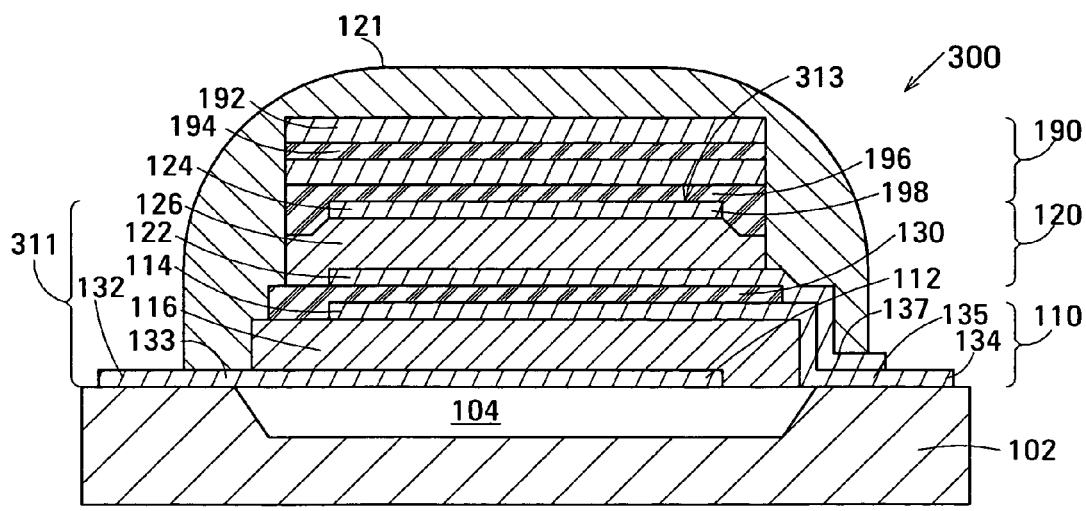
FIG. 6B is a cross-sectional view of the third embodiment of the encapsulated FBAR device shown in FIG. 6A along the section line 6B—6B.

FIGS. 6A and 6B are respectively a plan view and a cross-sectional view of a third exemplary embodiment 300 of an encapsulated FBAR device in accordance with the invention. FBAR device 300 is a band-pass filter in which the FBAR stack is composed of two FBARs and an acoustic decoupler between the FBARs. The FBARs and the acoustic decoupler constitute a single decoupled stacked bulk acoustic resonator (DSBAR). The example of FBAR device 300 shown in FIGS. 6A and 6B and described below has an acoustic Bragg reflector similar in structure to acoustic Bragg reflector 190 described above with reference to FIGS. 4A and 4B located between the top surface of the FBAR stack and the encapsulant to isolate the FBAR stack acoustically from the encapsulant. The acoustic Bragg reflector may alternatively be structured as described above with reference to FIGS. 4C and 4D. In the example of FBAR device 300 shown in FIGS. 6A and 6B and described below, the FBAR stack is suspended over a cavity defined in the substrate to isolate the FBAR stack acoustically from the substrate. FBAR device 300 may alternatively have an additional acoustic Bragg reflector similar to any of the embodiments of acoustic Bragg reflector 180 described above with reference to FIG. 5 between the substrate and the FBAR stack to isolate the FBAR stack acoustically from the substrate.

FBAR device 300 has a substrate 102, an FBAR stack 311 over the substrate, an element that acoustically isolates the FBAR stack from the substrate, an encapsulant 121 covering the FBAR stack, and an acoustic Bragg reflector 190 between the top surface 313 of the FBAR stack and the encapsulant.

In FBAR device 300, FBAR stack 311 is composed of lower FBAR 110, an upper FBAR 120 stacked on lower FBAR 110 and an acoustic decoupler 130 between the FBARs. FBAR 110 is composed of opposed planar electrodes 112 and 114 and piezoelectric element 116 between the electrodes. FBAR 120 is composed of opposed planar electrodes 122 and 124 and a piezoelectric element 126 between the electrodes.

Acoustic decoupler 130 is located between FBARs 110 and 120, specifically, between electrode 114 of FBAR 110 and electrode 122 of FBAR 120. The acoustic decoupler controls the coupling of acoustic energy between FBARs 110 and 120. The acoustic decoupler couples less acoustic energy between the FBARs than would be coupled by direct contact between the FBARs. In the example shown in FIG. 6B, acoustic decoupler 130 is composed of an acoustic decoupling layer of acoustic decoupling material.

In the example shown, FBAR stack 311 is suspended over cavity 104 defined in substrate 102. Cavity 104 performs the function of acoustically isolating FBAR stack 311 from substrate 102. Additionally, acoustic Bragg reflector 190 is located between encapsulant 121 and the top surface 313 of FBAR stack 311 to isolate the FBAR stack acoustically from the encapsulant. The structure of acoustic Bragg reflector 190 is described above with reference to FIGS. 4A and 4B. The large acoustic impedance ratio between the metal of metal Bragg layers 192 and 196 and the plastic material of plastic Bragg layers 194 and 198 enables acoustic Bragg reflector 190 to present a very low effective acoustic impedance to FBAR stack 311. The large acoustic impedance ratio between acoustic Bragg reflector 190 and FBAR stack 311 enables acoustic Bragg reflector 190 to provide sufficient acoustic isolation between FBAR stack 311 and encapsulant 121 to allow the FBARs 110 and 120 constituting DSBAR 106 to resonate mechanically in response to an input electrical signal applied between the electrodes of one of them. The acoustic energy generated in the FBAR that receives the input electrical signal passes through acoustic decoupler 130 into the other FBAR. The FBAR receiving the acoustic energy converts part of the acoustic energy into an electrical output signal provided between its electrodes. The electrical signal output between the electrodes of the FBAR receiving the acoustic energy has a band-pass frequency response characteristic substantially free of undesirable spurious artifacts arising from undesirable acoustic coupling between FBAR stack 311 and encapsulant 121.

In the example shown, the electrodes 112 and 114 of FBAR 110 are electrically connected to terminal pads 132 and 134, respectively, by electrical traces 133 and 135, respectively. Additionally, the electrodes 122 and 124 of FBAR 120 are electrically connected to terminal pads 134 and 138, respectively, by electrical traces 137 and 139. In an embodiment that provides electrical isolation between input and output, electrical trace 137 is connected to an additional terminal pad (not shown) instead of to terminal pad 134. Terminal pads 132, 134 and 138 are used to make electrical connections from FBAR device 300 to external electrical circuits (not shown).

In the example shown, an acoustic decoupling layer provides acoustic decoupler 130. The acoustic decoupling layer is also a quarter-wave layer of plastic material. The same plastic material may be used in the acoustic decoupling layer and plastic Bragg layers 194 and 198. The acoustic impedance of the plastic material of the acoustic decoupling layer determines the pass bandwidth of FBAR device 300. The need to provide a specified pass bandwidth may result in the acoustic decoupling layer being composed of a different plastic material from plastic Bragg layers 194 and 198.

Figure 7A:
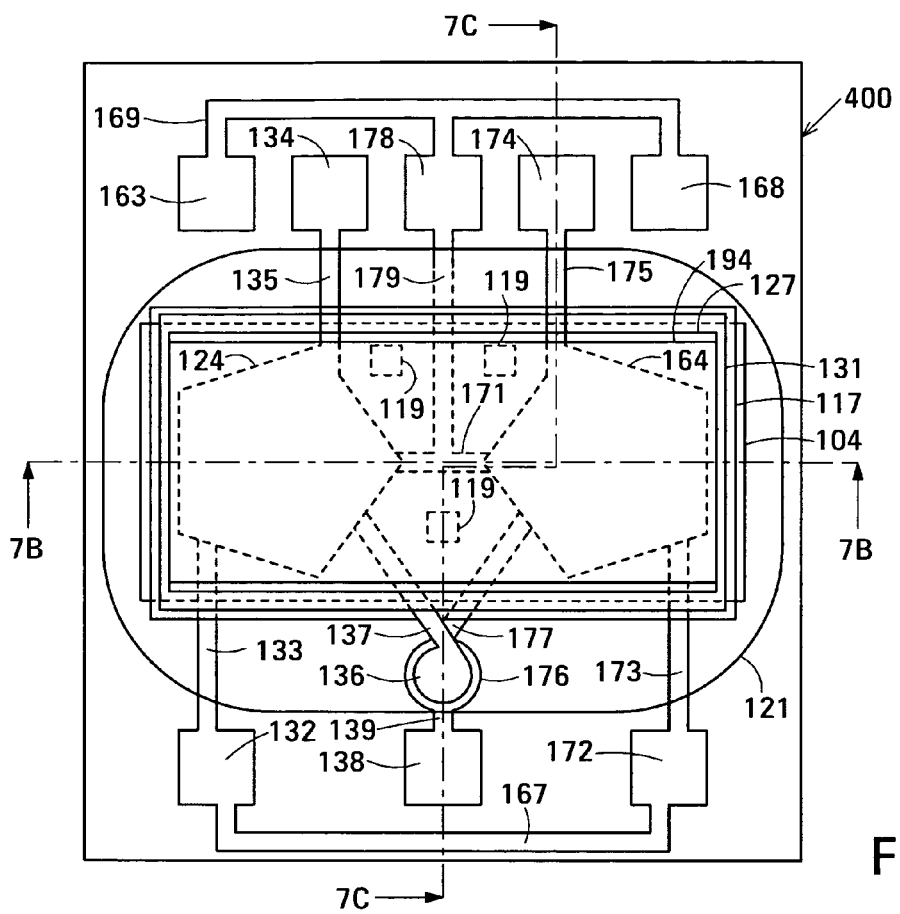
FIG. 7A is a plan view of a fourth embodiment of an encapsulated FBAR device in accordance with the invention.
Figure 7B:
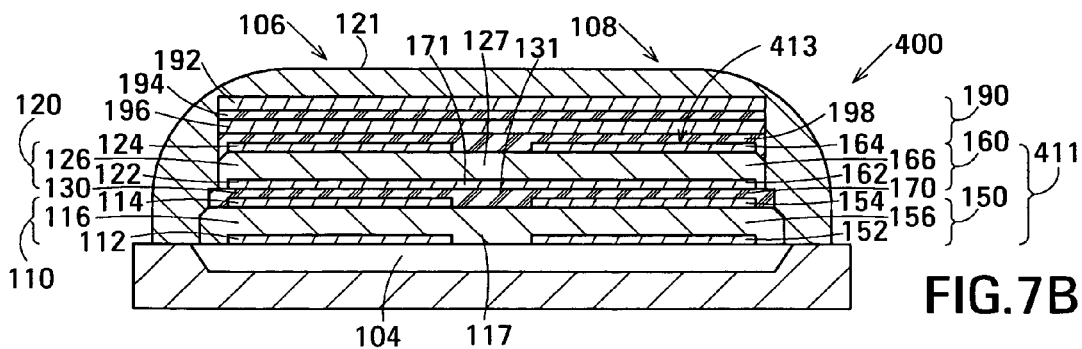
FIG. 7B is a cross-sectional view of the fourth embodiment of the FBAR device shown in FIG. 7A along the section line 7B—7B.
Figure 7C:
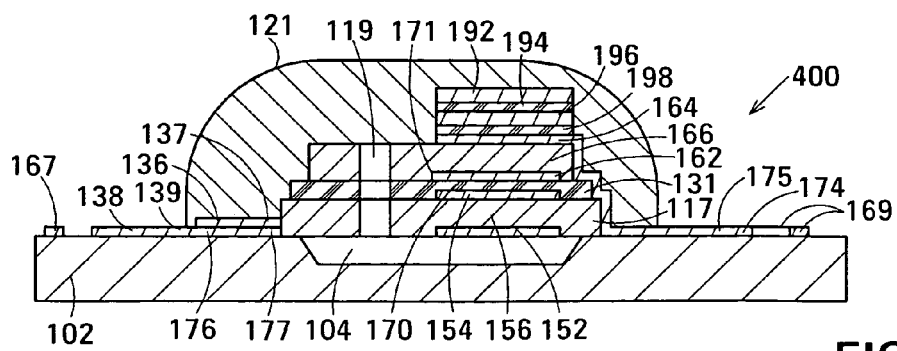
FIG. 7C is a cross-sectional view of the fourth embodiment of the FBAR device shown in FIG. 7A along the section line 7C—7C.
Figure 7D:
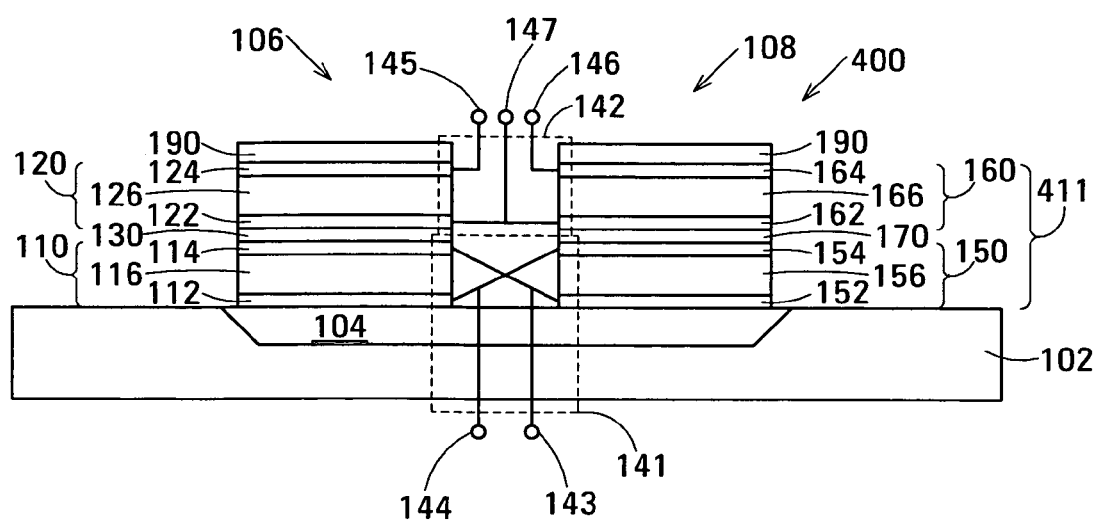
FIG. 7D is a schematic diagram of the electrical circuits of the fourth embodiment of the encapsulated FBAR device shown in FIG. 7A.

FIG. 7A is a plan view of a fourth exemplary embodiment 400 of an encapsulated FBAR device in accordance with the invention. FBAR device 400 is a film acoustically-coupled transformer (FACT) in which the FBAR stack is composed of four FBARs arranged as two decoupled stacked bulk acoustic resonators (DSBARs). FIGS. 7B and 7C are cross-sectional views along the section lines 7B—7B and 7C—7C, respectively, in FIG. 7A. FIG. 7D is a schematic drawing of the electrical circuits of the example of FACT 400 shown in FIG. 7A and described below. The example of FBAR device 400 shown in FIGS. 7A and 7B and described below has an acoustic Bragg reflector similar in structure to acoustic Bragg reflector 190 described above with reference to FIGS. 4A and 4B located between the top surface of the FBAR stack and the encapsulant to isolate the FBAR stack acoustically from the encapsulant. The acoustic Bragg reflector may alternatively be structured as described above with reference to FIGS. 4C and 4D. In the example of FBAR device 400 shown in FIGS. 7A and 7B and described below, the FBAR stack is suspended over a cavity defined in the substrate to isolate the FBAR stack acoustically from the substrate. FBAR device 400 may alternatively have an additional acoustic Bragg reflector similar to any of the embodiments of acoustic Bragg reflector 180 described above with reference to FIG. 5 between the substrate and the FBAR stack to isolate the FBAR stack acoustically from the substrate.

FACT 400 has a substrate 102, an FBAR stack 411 over the substrate, an element that acoustically isolates the FBAR stack from the substrate, an encapsulant 121 covering the FBAR stack, and an acoustic Bragg reflector 190 between the top surface 413 of the FBAR stack and the encapsulant. FBAR stack 411 comprises stacked bulk acoustic resonator (DSBAR) 106 and a DSBAR 108. DSBAR 106 is composed of lower FBAR 110, upper FBAR 120 stacked on lower FBAR 110 and acoustic decoupler 130 between the FBARs. DSBAR 108 is composed of a lower FBAR 150, an upper FBAR 160 stacked on lower FBAR 150 and an acoustic decoupler 170 between the FBARs. FACT 400 is additionally composed of an electrical circuit that interconnects the lower FBARs 110 and 150 of DSBARs 106 and 108, respectively, and an electrical circuit that interconnects the upper FBARs 120 and 160 of DSBARs 106 and 108, respectively. FIG. 7D shows an example in which an electrical circuit 141 connects the lower FBAR 110 of DSBAR 106 and the lower FBAR 150 of DSBAR 108 in anti-parallel, and an electrical circuit 142 connects the upper FBAR 120 of DSBAR 106 and the upper FBAR 160 of DSBAR 108 in series.

In DSBAR 106, lower FBAR 110 is composed of opposed planar electrodes 112 and 114 and a piezoelectric element 116 between the electrodes, and upper FBAR 120 is composed of opposed planar electrodes 122 and 124 and a piezoelectric element 126 between the electrodes. In DSBAR 108, lower FBAR 150 is composed of opposed planar electrodes 152 and 154 and a piezoelectric element 156 between the electrodes, and upper FBAR 160 is composed of opposed planar electrodes 162 and 164 and a piezoelectric element 166 between the electrodes.

In FACT 400, acoustic decoupler 130 of DSBAR 106 is located between lower FBAR 110 and upper FBAR 120; specifically, between electrode 114 of lower FBAR 110 and electrode 122 of upper FBAR 120. Acoustic decoupler 130 controls the coupling of acoustic energy between FBARs 110 and 120. Acoustic decoupler 130 couples less acoustic energy between the FBARs 110 and 120 than would be coupled if the FBARs were in direct contact with one another as they would be in a conventional stacked bulk acoustic resonator (SBAR). Additionally, acoustic decoupler 170 of DSBAR 108 is located between FBARs 150 and 160; specifically, between electrode 154 of lower FBAR 150 and electrode 162 of upper FBAR 160. Acoustic decoupler 170 controls the coupling of acoustic energy between FBARs 150 and 160. Acoustic decoupler 170 couples less acoustic energy between the FBARs 150 and 160 than would be coupled if the FBARs were in direct contact with one another. The coupling of acoustic energy defined by acoustic decouplers 130 and 170 determines the pass bandwidth of FACT 400.

In the example shown in FIGS. 7A–7C, acoustic decouplers 130 and 170 are respective parts of an acoustic decoupling layer 131. In other embodiments, acoustic decouplers 130 and 170 are each composed of acoustic decoupling layers of acoustic decoupling materials having different acoustic impedances, as described in U.S. patent application Ser. No. 10/965,449 of John D. Larson et al., entitled Pass Bandwidth Control In Decoupled Stacked Bulk Acoustic Resonator Devices assigned to the assignee of this disclosure and incorporated by reference. In other embodiments, acoustic decouplers 130 and 170 are structurally independent.

Acoustic Bragg reflector 190 located between the top surface 413 of FBAR stack 411 and encapsulant 121 provides acoustic isolation between DSBARs 106 and 108 and the encapsulant. The structure of acoustic Bragg reflector 190 is described above with reference to FIGS. 4A and 4B. The large acoustic impedance ratio between the metal of metal Bragg layers 192 and 196 and the plastic material of plastic Bragg layers 194 and 198 enables acoustic Bragg reflector 190 to present a very high effective impedance to DSBAR 106 and DSBAR 108. The large acoustic impedance ratio between acoustic Bragg reflector 190 and DSBARs 106 and 108 enables acoustic Bragg reflector 190 to provide sufficient acoustic isolation between DSBARs 106 and 108 and encapsulant 121 to allow FBARs 110 and 120 to resonate mechanically in response to an input electrical signal applied between the electrodes of one of them and to allow FBARs 150 and 160 to resonate mechanically in response to an input electrical signal applied between the electrodes of one of them. In each DSBAR, the acoustic energy generated in the FBAR that receives the input electrical signal passes through the respective acoustic decoupler 130 or 170 to the other FBAR. The FBAR receiving the acoustic energy converts part of the acoustic energy into an electrical output signal provided between its electrodes. The electrical signal output between the electrodes of the FBAR receiving the acoustic energy has a band-pass frequency response characteristic substantially free of undesirable spurious artifacts.

FIG. 7D schematically shows an example of the electrical circuits that interconnect DSBARs 106 and 108 and connect DSBARs 106 and 108 to external electrical circuits (not shown). Electrical circuit 141 connects lower FBARs 110 and 150 in anti-parallel and to signal terminal 143 and ground terminal 144. In the embodiment shown in FIGS. 7A–7C, terminal pad 138 provides signal terminal 143 and terminal pads 132 and 172 provide ground terminal 144. In the embodiment, electrical circuit 141 is provided by an electrical trace 133 that extends from terminal pad 132 to electrode 112 of FBAR 110, an electrical trace 137 that extends from electrode 114 of FBAR 110 to an interconnection pad 136 in electrical contact with an interconnection pad 176, an electrical trace 139 that extends from interconnection pad 176 to signal pad 138, an electrical trace 177 that extends from interconnection pad 176 to electrode 152 of FBAR 150, an electrical trace 173 that extends from electrode 154 of FBAR 150 to terminal pad 172 and an electrical trace 167 that interconnects terminal pads 132 and 172.

In the exemplary electrical schematic shown in FIG. 7D, electrical circuit 142 connects upper FBARs 120 and 160 in series and to signal terminals 145 and 146 and to optional center-tap terminal 147. In the embodiment shown in FIGS. 7A–7C, terminal pads 134 and 174 provide signal pads 145 and 146 and terminal pad 178 provides center-tap terminal 147. In the embodiment, electrical circuit 142 is provided by an electrical trace 135 that extends from terminal pad 134 to electrode 124 of FBAR 120, an electrical trace 171 that extends from electrode 122 of FBAR 120 to electrode 162 of FBAR 160, an electrical trace 179 that extends from trace 171 to center-tap 137, and an electrical trace 175 that extends from electrode 164 of FBAR 160 to terminal pad 174. Also shown are terminal pads 163 and 168 interconnected by an electrical trace 169 that provide local grounds for terminal pads 134 and 174. In the example shown, electrical trace 169 additionally extends to terminal pad 178. In other examples, terminal pad 178 is left floating.

The electrical connections exemplified in FIG. 7D provide a FACT with a balanced primary and a 4:1 impedance transformation ratio or a FACT with a balanced secondary and a 1:4 impedance transformation ratio. The lower FBARs may alternatively be interconnected in parallel, series, and anti-series, and the upper FBARs may alternatively be interconnected in parallel, anti-parallel and anti-series to achieve other impedance transformation ratios as shown in Table 1 below.

TABLE 1

|  | Parallel | Series | Anti-parallel. | Anti-series |
|---|---|---|---|---|
| Parallel | U 1:1 LOW | X | X | U 1:4 |
| Series | X | B 1:1 HI | B 4:1 | X |
| Anti-parallel. | X | B 1:4 | B 1:1 LOW | X |
| Anti-series | U 4:1 | X | X | U 1:1 HI |

In Table 1, the row captions indicate the configuration of electrical circuit 141, the column captions indicate the configuration of electrical circuit 142, B denotes that the FACT is electrically balanced, U denotes that the FACT is unbalanced, and X denotes a non-functioning FACT. The impedance transformation ratio shown is the impedance transformation from the configuration of electrical circuit 141 indicated by the row caption to the configuration of electrical circuit 142 indicated by the column caption. For the configurations having a 1:1 impedance transformation ratio, LOW denotes that the FACT has a low impedance, equivalent to that of two FBARs in parallel, and HI indicates that the FACT has a high impedance, equivalent to that of two FBARs in series.

Wafer-scale fabrication is used to fabricate thousands of FBAR devices similar to above-described FBAR devices 100, 200, 300 or 400 at the same time. Such wafer-scale fabrication makes the FBAR devices inexpensive to fabricate. An example of the fabrication method used to fabricate an embodiment of FBAR device 300 described above with reference to FIGS. 6A and 6B will be described next with reference to the plan views of FIGS. 8A–8M and the cross-sectional views of FIGS. 8K–8Z. With different masks, the process can also be used to fabricate embodiments of FBAR devices 100, 200 and 400. The pass band of the embodiment of FBAR device 300 whose fabrication will be described has a nominal center frequency of about 1.9 GHz. Embodiments for operation at other frequencies are similar in structure and fabrication but have thicknesses and lateral dimensions different from those exemplified below. The example of FBAR device 300 whose fabrication will be described below has an acoustic Bragg reflector similar in structure to acoustic Bragg reflector 190 described above with reference to FIGS. 4A and 4B. The described process can be modified to deposit fewer Bragg layers to fabricate acoustic Bragg reflectors structured as described above with reference to FIGS. 4C and 4D.

A wafer of single-crystal silicon is provided. A portion of the wafer constitutes, for each FBAR device being fabricated, a substrate corresponding to the substrate 102 of FBAR device 300. FIGS. 8A–8M and FIGS. 8N–8Z illustrate and the following description describes the fabrication of FBAR device 300 in and on a portion of the wafer that constitutes substrate 102. As FBAR device 300 is fabricated, the remaining FBAR devices on the wafer are similarly fabricated.

Figure 8A:
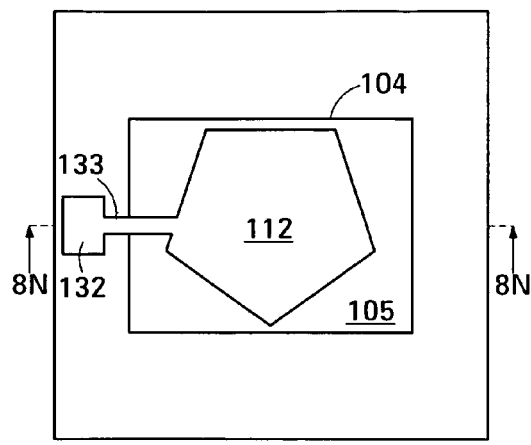
Figure 8N:
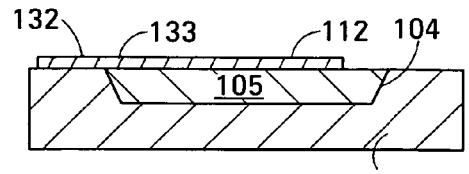

The wafer is selectively wet etched to form a cavity 104, as shown in FIGS. 8A and 8N, in the location of each FBAR device. A layer of fill material (not shown) is deposited on the surface of the wafer with a thickness sufficient to fill each cavity. The surface of the wafer is then planarized, leaving each cavity filled with fill material. FIGS. 8A and 8N also show cavity 104 in substrate 102 filled with fill material 105.

In an embodiment, the fill material was phosphosilicate glass (PSG) and was deposited using conventional low-pressure chemical vapor deposition (LPCVD). The fill material may alternatively be deposited by sputtering or by spin coating.

As an alternative to forming and filling cavity 104 with fill material 105, alternating Bragg layers of metal and plastic are deposited on the surface of wafer 102 and are patterned to define an acoustic Bragg reflector similar to acoustic Bragg reflector 180 shown in FIG. 5. Acoustic Bragg reflector 180 or cavity 104 performs the function of acoustically isolating FBAR stack 311 (FIG. 6B) from substrate 102, as described above.

A first metal layer is deposited on the major surface of substrate 102 and fill material 105. The first metal layer is patterned as shown in FIGS. 8A and 8N to define electrode 112, terminal pad 132, and electrical trace 133 extending between electrode 112 and terminal pad 132.

Electrode 112 typically has an asymmetrical shape in a plane parallel to the major surface of the wafer. An asymmetrical shape minimizes lateral modes in FBAR 110 (FIG. 6B) of which electrode 112 forms part. This is described in U.S. Pat. No. 6,215,375 of Larson III et al., incorporated by reference. Electrode 112 leaves part of the surface of fill material 105 exposed so that the fill material can later be removed by etching, as will be described below.

Referring additionally to FIG. 6B, electrode 114 is defined in a second metal layer, electrode 122 is defined in a third metal layer and electrode 124 is defined in a fourth metal layer, as will be described in detail below. The metal layers in which the electrodes are defined are patterned such that, in respective planes parallel to the major surface of the wafer, electrodes 112 and 114 of FBAR 110 have the same shape, size, orientation and position and electrodes 122 and 124 of FBAR 120 have the same shape, size, orientation and position. Typically, electrodes 114 and 122 additionally have the same shape, size, orientation and position.

In an embodiment, the material of each of the metal layers was molybdenum deposited by sputtering to a thickness of about 300 nm. The metal layers were each patterned by dry etching. The electrodes defined in each of the metal layers were pentagonal each with an area of about 12,000 square μm. Other electrode areas give other characteristic impedances. Other refractory metals such as tungsten, niobium and titanium may alternatively be used as the material of the metal layers. The metal layers may each alternatively comprise layers of more than one material.

One factor to be considered in choosing the material of the electrodes of FBAR device 300 is the acoustic properties of the electrode material: the acoustic properties of the material(s) of the remaining metal parts of FBAR device are less important than other properties such as electrical conductivity. Thus, material(s) of the remaining metal parts of FBAR device 300 may be different from the material of the electrodes.

Figure 8B:
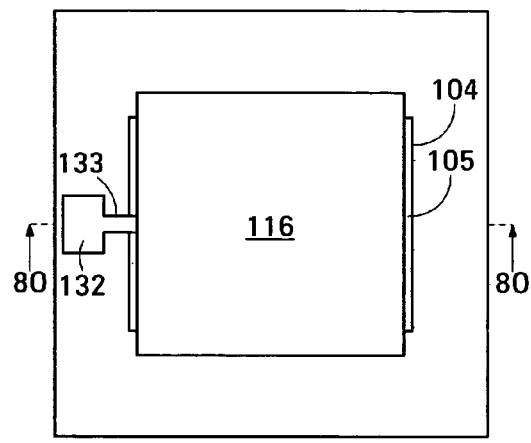
Figure 8O:
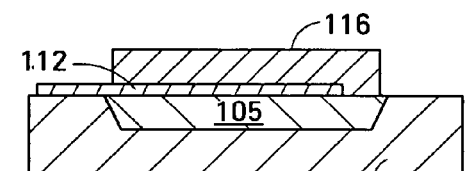

A layer of piezoelectric material is deposited and is patterned as shown in FIGS. 8B and 8O to define piezoelectric element 116. The piezoelectric layer is patterned to cover electrode 112, but to expose terminal pad 132 and part of the surface of fill material 105. Other portions of piezoelectric element 116 extend over substrate 102 outside cavity 104.

In an embodiment, the piezoelectric material deposited to form piezoelectric element 116 and piezoelectric element 126 described below was aluminum nitride and was deposited with a thickness of about 1.4 μm by sputtering. The piezoelectric material was patterned by wet etching in potassium hydroxide or by chlorine-based dry etching. Alternative materials for piezoelectric elements 116 and 126 include zinc oxide, cadmium sulfide and poled ferroelectric materials such as perovskite ferroelectric materials, including lead zirconium titanate, lead meta niobate and barium titanate.

Figure 8C:
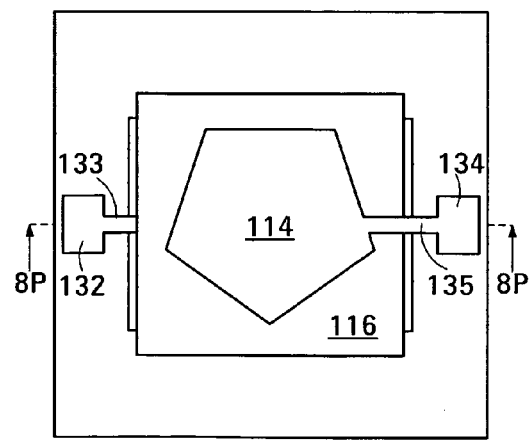
Figure 8P:
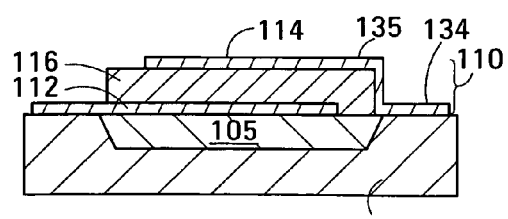

The second metal layer is deposited and is patterned to define electrode 114, terminal pad 134 and electrical trace 135 extending between electrode 114 and terminal pad 134, as shown in FIGS. 8C and 8P. This completes fabrication of FBAR 110.

A layer of acoustic decoupling material is then deposited and is patterned to define acoustic decoupler 130, as shown in FIGS. 8D and 8Q. Acoustic decoupler 130 is patterned to cover at least electrode 114, and is additionally patterned to expose terminal pads 132 and 134 and part of fill material 105. Acoustic decoupler is typically a third Bragg layer of plastic material.

In an embodiment, the acoustic decoupling material of acoustic decoupler 130 was polyimide with a thickness of about 200 nm, i.e., one quarter of the center frequency wavelength in the polyimide. The polyimide was deposited by spin coating, and was patterned by photolithography. Polyimide is photosensitive so that no photoresist is needed. As noted above, other plastic materials can be used as the acoustic decoupling material. The acoustic decoupling material can be deposited by methods other than spin coating.

In an embodiment in which the acoustic decoupling material was polyimide, after depositing and patterning the polyimide, the wafer was baked initially at a temperature of about 250° C. in air and finally at a temperature of about 415° C. in an inert atmosphere, such as a nitrogen atmosphere, before further processing was performed. The bake evaporates volatile constituents of the polyimide and prevents the evaporation of such volatile constituents during subsequent processing from causing separation of subsequently-deposited layers.

The third metal layer is deposited and is patterned to define electrode 122 and electrical trace 137 extending from electrode 122 to terminal pad 134, as shown in FIGS. 8E and 8R. Terminal pad 134 is also electrically connected to electrode 114 by trace 135.

A second layer of piezoelectric material is deposited and is patterned as shown in FIGS. 8F and 8S to define piezoelectric element 126. The second piezoelectric layer is patterned to expose terminal pads 132 and 134 and part of fill material 105.

Figure 8G:
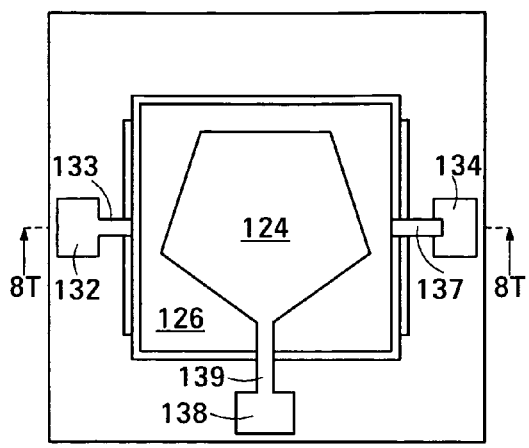
Figure 8T:
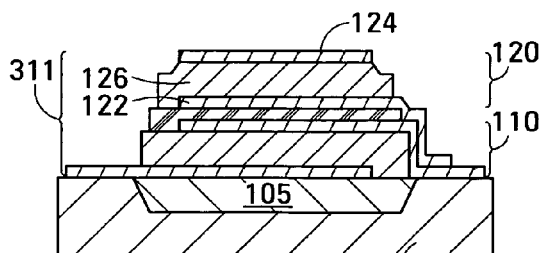

The fourth metal layer is deposited and is patterned to define electrode 124, terminal pad 138 and an electrical trace 139 extending from electrode 124 to terminal pad 138, as shown in FIGS. 8G and 8T. This completes fabrication of FBAR 120 and FBAR stack 311.

A gold protective layer (not shown) is deposited on the exposed surfaces of terminal pads 132, 134 and 138. Additionally, in embodiments in which the encapsulant is metallized as described below, an insulating layer (not shown) is deposited over each of the electrical traces 133, 137 and 139.

Figure 8H:
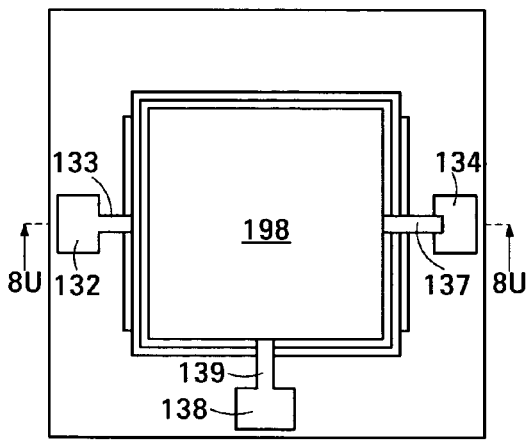
Figure 8U:
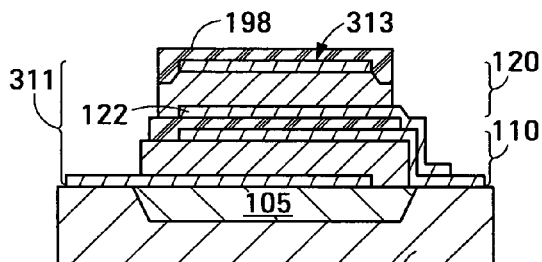

A layer of plastic material is deposited on the top surface 313 of FBAR stack 311 and is patterned as shown in FIGS. 8H and 8U to form second plastic Bragg layer 198.

In one embodiment, the plastic material deposited to form second plastic Bragg layer 198 and first plastic Bragg layer 194 whose deposition is described below was polyimide. The polyimide was spun on, cured and patterned to define second plastic Bragg layer 198 and first plastic Bragg layer 194 each with a thickness of about 200 nm, i.e., one quarter of the center frequency wavelength in the polyimide. Patterning polyimide is described above. After depositing each layer of polyimide, the wafer was baked initially at a temperature of about 250° C. in air and finally at a temperature of about 415° C. in an inert atmosphere, such as a nitrogen atmosphere, before further processing was performed. The bake evaporates volatile constituents of the polyimide and prevents the evaporation of such volatile constituents during subsequent processing from causing separation of subsequently-deposited layers.

In another embodiment, the plastic material deposited to form second plastic Bragg layer 198 and first plastic Bragg layer 194 was parylene deposited by vacuum deposition from the dimer precursor di-para-xylylene.

In another embodiment, the plastic material deposited to form second plastic Bragg layer 198 and first plastic Bragg layer 194 was a precursor solution for a crosslinked polyphenylene polymer. The precursor solution was spun, cured and patterned to define second plastic Bragg layer 198 and first plastic Bragg layer 194 each with a thickness of about 187 nm, i.e., one quarter of the center frequency wavelength in the crosslinked polyphenylene polymer. Patterning crosslinked polyphenylene polymer will be described below. In an example, the precursor solution for the crosslinked polyphenylene polymer was one sold by The Dow Chemical Company and designated SiLK™ J. Alternatively, the precursor solution may be any suitable one of the precursor solutions now or in the future sold by The Dow Chemical Company under the trademark SiLK. In certain embodiments, a layer of an adhesion promoter was deposited before the precursor solution was spun on. Precursor solutions containing oligomers that, when cured, form a crosslinked polyphenylene polymer having an acoustic impedance of about 2 Mrayl may be available from other suppliers now or in the future and may also be used. After depositing each layer of the precursor solution, the wafer wass baked at a temperature in the range from about 385° C. to about 450° C. in an inert ambient, such as under vacuum or in a nitrogen atmosphere, before further processing is performed. The bake first drives off the organic solvents from the precursor solution, and then causes the oligomer to cross link as described above to form the crosslinked polyphenylene polymer.

Figure 8I:
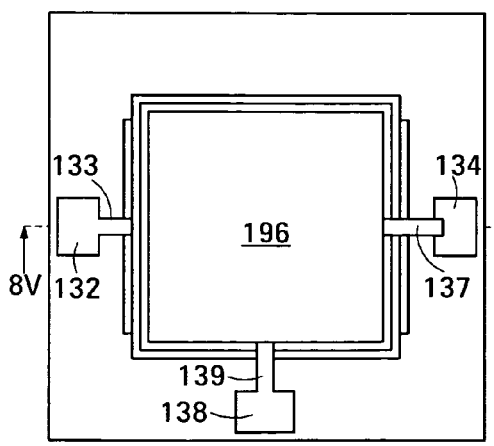
Figure 8V:
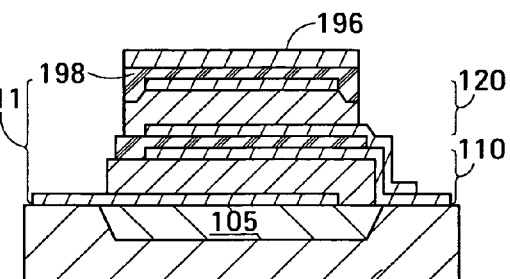

A fifth metal layer is deposited on the surface of second plastic Bragg layer 184 and is patterned to define second metal Bragg layer 196, as shown in FIGS. 8I and 8V.

In one embodiment, the fifth metal layer and the sixth metal layer whose deposition will be described below were respective layers of molybdenum each deposited to a thickness of about 800 nm by sputtering. In another embodiment with three or more Bragg layers, the thickness of the fifth metal layer and the sixth metal layer was 300 nm, as described above. The metal layers were patterned by dry etching. Other refractory metals such as tungsten, niobium and titanium may alternatively be used as the material of the fifth and sixth metal layers.

Figure 8J:
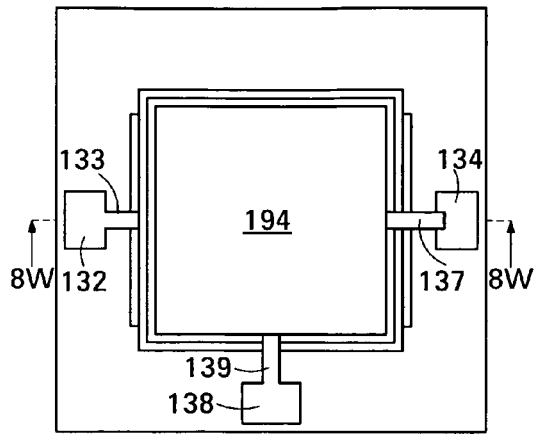
Figure 8W:
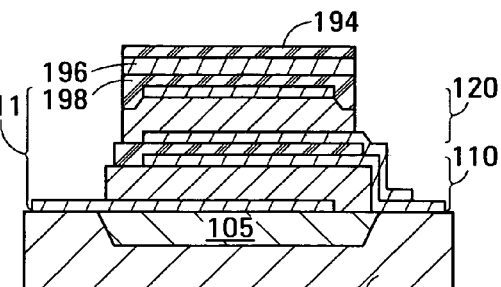

A layer of plastic material is deposited as described above on the surface of second metal Bragg layer 196 and was patterned to define first plastic Bragg layer 194, as shown in FIGS. 8J and 8W.

Figure 8K:
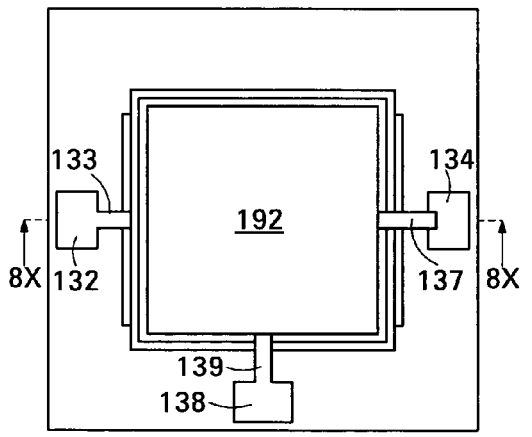
Figure 8X:
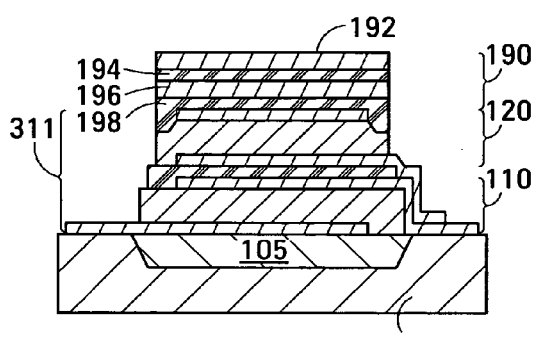
Figure 8L:
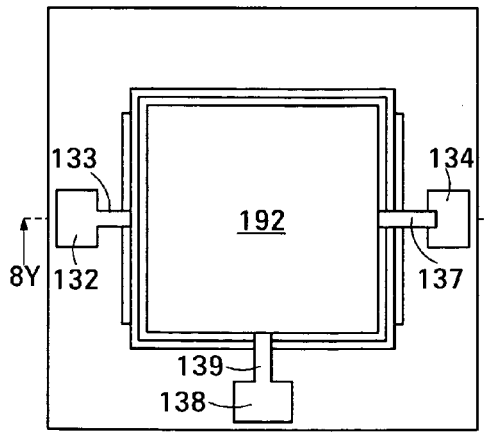
Figure 8Y:
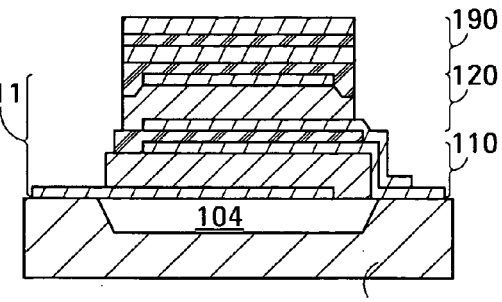

The sixth metal layer is deposited on the surface of first plastic Bragg layer 194, and is patterned to define first metal Bragg layer 192, as shown in FIGS. 8K and 8X. Deposition of the sixth metal layer to form first metal Bragg layer 192 completes the fabrication of acoustic Bragg reflector 190.

Figure 8M:
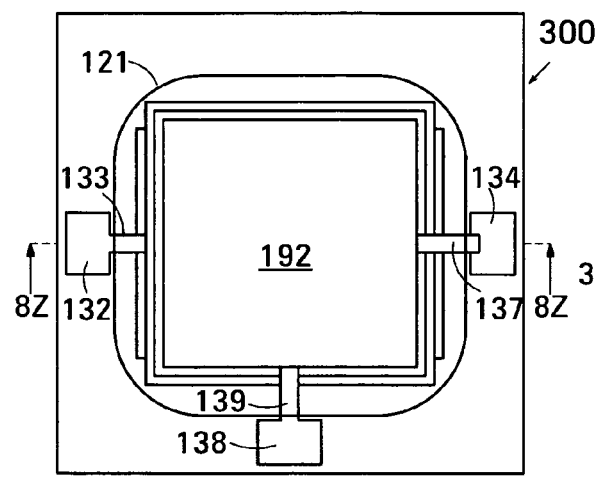
Figure 8Z:
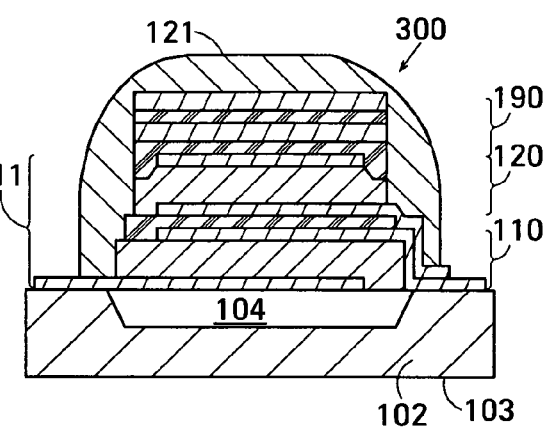

FBAR stack 311 and acoustic Bragg reflector 190 are then covered by encapsulant 121, as shown in FIGS. 8M and 8Z.

In an embodiment, a drop of encapsulant material is applied to the exposed surface of acoustic Bragg reflector 190. The encapsulant material runs off acoustic Bragg reflector to cover the top and sides of acoustic Bragg reflector 190 and FBAR stack 311. The encapsulant material is cured to form encapsulant 121. In one embodiment, the encapsulant material is polyimide. The polyimide encapsulant material is cured as described above to form encapsulant 121.

In other embodiments the encapsulant material is applied by injection molding. Alternative encapsulant materials are a room-temperature vulcanizing rubber (RTV), a glass-loaded epoxy or another suitable encapsulant material. Other application techniques are possible.

In embodiments that need hermetic encapsulation, an additional process is performed in which the cured encapsulant material is covered with a metal sealing layer (not shown) to form encapsulant 121. Suitable materials of the metal sealing layer include aluminum and gold. The metal sealing layer substantially reduces the porosity of the encapsulant. The metal sealing layer is patterned to expose terminal pads 132, 134 and 138. The above-described insulating layer applied to electrical traces 133, 137 and 139 prior to the encapsulation prevents the metal sealing layer from electrically interconnecting the electrical traces. Alternatively, encapsulant 121 may cover the terminal pads. In such embodiment, vias extend through substrate 102 to connect terminal pads 132, 134 and 138 to terminal pads located opposite terminal pads 132, 134 and 138 on the surface 103 of substrate 102.

The wafer is then divided into individual FBAR devices, including FBAR device 300.

FBAR device 300 is mounted in a host electrical apparatus, such as a wireless telephone, and electrical connections are made between terminal pads 132, 134 and 138 of the FBAR device and pads that are part of the host device.

As noted above, an alternative acoustic decoupling material of acoustic decoupler 130 is a crosslinked polyphenylene polymer. After the third metal layer has been patterned to define electrode 114, as described above with reference to FIGS. 8C and 8P, the precursor solution for the crosslinked polyphenylene polymer is spun on in a manner similar to that described above with reference to FIGS. 8D and 8Q, but is not patterned. The formulation of the precursor solution and the spin speed are selected so that the crosslinked polyphenylene polymer forms a layer with a thickness of about 187 nm. This corresponds to one quarter of the wavelength $\lambda_n$ in the crosslinked polyphenylene polymer of an acoustic signal having a frequency equal to the center frequency of the pass band of FBAR device 300. The wafer is then baked as described above to cause the oligomer that forms part of the precursor solution to cross link to form the crosslinked polyphenylene polymer.

The third metal layer is then deposited on the layer of the crosslinked polyphenylene polymer in a manner similar to that described above with reference to FIGS. 8E and 8R, but is initially patterned similarly to the patterning of acoustic decoupler 130 shown in FIG. 8D to define a hard mask that will later be used to pattern the layer of the crosslinked polyphenylene polymer to define acoustic decoupler 130. The initially-patterned third metal layer has the same extent as acoustic decoupler 130 and exposes terminal pads 132 and 134 and parts of fill material 105.

The layer of the crosslinked polyphenylene polymer is then patterned as shown in FIG. 8D with the initially-patterned third metal layer being used as a hard etch mask. Patterning the layer of the crosslinked polyphenylene polymer defines the extent of acoustic decoupler 130, which exposes terminal pads 132 and 134 and parts of fill material 105. The patterning is performed with an oxygen plasma etch.

The third metal layer is then re-patterned as shown in FIGS. 8E and 8R to define electrode 122 and electrical trace 137 extending between electrode 122 and terminal pad 134.

Fabrication of the embodiment of FBAR device 300 with a layer of a crosslinked polyphenylene polymer as its acoustic decoupler is completed by performing the processing described above with reference to FIGS. 8F–8M and 8S–8M.

Similarly, in embodiments in which second plastic Bragg layer 198 is a layer of a crosslinked polyphenylene polymer, the layer of crosslinked polyphenylene polymer deposited to form second plastic Bragg layer 198 is deposited, and the fifth metal layer is deposited. The fifth metal layer is then initially patterned to define second plastic Bragg layer 198, the layer of the crosslinked polyphenylene polymer is patterned using the initially-patterned fifth metal layer as a hard etch mask, and the fifth metal layer is then re-patterned to define second metal Bragg layer 196. In embodiments, such as the embodiment shown in FIGS. 8H and 8I, in which the second plastic Bragg layer and the second metal Bragg layer have the same extent, the initial patterning of the fifth metal layer defines second metal Bragg layer 196, and the above-described re-patterning of the fifth metal layer is omitted. A similar technique can be used to define second plastic Bragg layer 198 in a layer of parylene.

Similarly, in embodiments in which first plastic Bragg layer 194 is a layer of a crosslinked polyphenylene polymer, the layer of crosslinked polyphenylene polymer deposited to form first plastic Bragg layer 194 is deposited, and the sixth metal layer is deposited. The sixth metal layer is then initially patterned to define first plastic Bragg layer 194, the layer of the crosslinked polyphenylene polymer is patterned using the initially-patterned sixth metal layer as a hard etch mask, and the sixth metal layer is then re-patterned to define first metal Bragg layer 192. In embodiments, such as the embodiment shown in FIGS. 8J and 8K, in which the first plastic Bragg layer and the first metal Bragg layer have the same extent, the initial patterning of the sixth metal layer defines first metal Bragg layer 192, and the above-described re-patterning of the sixth metal layer is omitted. A similar technique can be used to define first plastic Bragg layer 196 in a layer of parylene.

This disclosure describes the invention in detail using illustrative embodiments. However, the invention defined by the appended claims is not limited to the precise embodiments described.

We claim:

1. An encapsulated film bulk acoustic resonator (FBAR) device, comprising:
   a substrate;
   an FBAR stack over the substrate, the FBAR stack comprising an FBAR and having a top surface remote from the substrate, the FBAR comprising opposed planar electrodes and a piezoelectric element between the electrodes;
   means for acoustically isolating the FBAR stack from the substrate;
   encapsulant covering the FBAR stack; and
   an acoustic Bragg reflector between the top surface of the FBAR stack and the encapsulant, the acoustic Bragg reflector comprising a metal Bragg layer and a plastic Bragg layer juxtaposed with the metal Bragg layer, wherein:

the FBAR device has a band-pass characteristic having a center frequency; at least one of the Bragg layers has a nominal thickness equal to one quarter of the wavelength in the material of the respective Bragg layer of an acoustic signal equal in frequency to the center frequency; and the metal Bragg layer is thinner than the nominal thickness.

2. The encapsulated FBAR device of claim 1, in which the plastic Bragg layer comprises polyimide.

3. The encapsulated FBAR device of claim 1, in which the plastic Bragg layer comprises parylene.

4. The encapsulated FBAR device of claim 1, in which the plastic Bragg layer comprises a crosslinked polyphenylene polymer.

5. The encapsulated FBAR device of claim 1, in which the metal Bragg layer is juxtaposed with the encapsulant.

6. The encapsulated FBAR device of claim 1, in which the metal Bragg layer comprises a refractory metal.

7. The encapsulated FBAR device of claim 1, in which: the metal Bragg layer is a first metal Bragg layer; the acoustic Bragg reflector additionally comprises a second metal Bragg layer juxtaposed with the plastic Bragg layer opposite the first metal Bragg layer.

8. The encapsulated FBAR device of claim 7, in which: the plastic Bragg layer is a first plastic Bragg layer; The acoustic Bragg reflector additionally comprises a second plastic Bragg layer juxtaposed with the second metal Bragg layer opposite the first plastic Bragg layer.

9. The encapsulated FBAR device of claim 1, in which: the FBAR is a lower FBAR; and the FBAR device additionally comprises: an upper FBAR stacked on the lower FBAR, the upper FBAR comprising opposed planar electrodes and a piezoelectric element between the electrodes, and an acoustic decoupler between the FBARs.

10. The encapsulated FBAR device of claim 9, in which: the lower FBAR, the upper FBAR and the acoustic decoupler constitute a first decoupled stacked bulk acoustic resonator (DSBAR); the FBAR stack additionally comprises a second DSBAR, comprising a lower FBAR, an upper FBAR and an acoustic decoupler between the FBARs; and the FBAR device additionally comprises: a first electrical circuit interconnecting the lower FBARs, and a second electrical circuit interconnecting the upper FBARs.

11. The encapsulated FBAR device of claim 9, in which the metal Bragg layer comprises a refractory metal.

12. The encapsulated FBAR device of claim 9, in which at least one of the plastic Bragg layers comprises polyimide.

13. The encapsulated FBAR device of claim 9, in which at least one of the plastic Bragg layers comprises parylene.

14. The encapsulated FBAR device of claim 9, in which at least one of the plastic Bragg layer comprises a crosslinked polyphenylene polymer.

15. The encapsulated FBAR device of claim 1, in which: the FBAR is a first FBAR; the FBAR stack additionally comprises one or more additional FBARs; and the FBARs are interconnected as a ladder filter.

16. The encapsulated FBAR device of claim 1, in which the means for acoustically isolating the FBAR stack from the substrate comprises a cavity defined in the substrate over which the FBAR stack is suspended.

17. The encapsulated FBAR device of claim 1, in which: the acoustic Bragg reflector is a first acoustic Bragg reflector, and the means for acoustically isolating the FBAR stack from the substrate comprises a second acoustic Bragg reflector, the second acoustic Bragg reflector comprising a metal Bragg layer juxtaposed with a plastic Bragg layer.

18. An encapsulated film bulk acoustic resonator (FBAR) device, comprising:

a substrate;

an FBAR stack over the substrate, the FBAR stack comprising an FBAR and having a top surface remote from the substrate, the FBAR comprising opposed planar electrodes and a piezoelectric element between the electrodes;

means for acoustically isolating acoustically the FBAR stack from the substrate; encapsulant covering the FBAR stack; and an acoustic Bragg reflector between the top surface of the FBAR stack and the encapsulant, the acoustic Bragg reflector comprising a first Bragg layer and a second Bragg layer juxtaposed with the first Bragg layer, the first Bragg layer comprising a first material having an acoustic impedance less than five Mrayl and the second Bragg layer comprising a second material having an acoustic impedance greater than 50 Mrayl wherein:

the FBAR device has a band-pass characteristic having a center frequency: at least one of the Bragg layers has a nominal thickness equal to one quarter of the wavelength in the material of the respective Bragg layer of an acoustic signal equal in frequency to the center frequency; and the metal Bragg layer is thinner than the nominal thickness.

19. The FBAR device of claim 18, in which: the first material has an acoustic impedance less than three Mrayl; and the second material has an acoustic impedance greater than 60 Mrayl.

20. An encapsulated film bulk acoustic resonator (FBAR) device, comprising:

a substrate;

an FBAR stack over the substrate, the FBAR stack comprising an FBAR and having a top surface remote from the substrate, the FBAR comprising opposed planar electrodes and a piezoelectric element between the electrodes;

means for acoustically isolating acoustically the FBAR stack from the substrate;

encapsulant covering the FBAR stack;

and an acoustic Bragg reflector between the top surface of the FBAR stack and the encapsulant, the acoustic Bragg reflector comprising a first Bragg layer and a second Bragg layer juxtaposed with the first Bragg layer, the first Bragg layer comprising a first material having a first acoustic impedance and the second Bragg layer comprising a second material having a second acoustic impedance, the second acoustic impedance and the first acoustic impedance having a ratio greater than ten wherein:

the FBAR device has a band-pass characteristic having a center frequency; at least one of the Bragg layers has a nominal thickness equal to one quarter of the wavelength in the material of the respective Bragg layer of an acoustic signal equal in frequency to the center frequency; and the metal Bragg layer is thinner than the nominal thickness.

21. The FBAR device of claim 20, in which the second acoustic impedance and the first acoustic impedance have a ratio greater than 16.

* * * * *